US012593688B2

(12) United States Patent
Tong et al.

(10) Patent No.: US 12,593,688 B2
(45) Date of Patent: Mar. 31, 2026

(54) MANUFACTURING METHOD OF DIAMOND COMPOSITE WAFER

(71) Applicants: nD-HI Technologies Lab, Inc., Taipei City (TW); ETRON TECHNOLOGY, INC., Hsinchu (TW)

(72) Inventors: Ho-Ming Tong, Taipei City (TW); Wei Yen, Taipei City (TW); Chao-Chun Lu, Hsinchu (TW)

(73) Assignees: ND-HI TECHNOLOGIES LAB, INC., Taipei City (TW); ETRON TECHNOLOGY, INC., Hsinchu (TW)

( * ) Notice: Subject to any disclaimer, the term of this patent is extended or adjusted under 35 U.S.C. 154(b) by 692 days.

(21) Appl. No.: 17/970,964

(22) Filed: Oct. 21, 2022

(65) Prior Publication Data

US 2024/0047297 A1 Feb. 8, 2024

Related U.S. Application Data

(60) Provisional application No. 63/395,887, filed on Aug. 8, 2022.

(51) Int. Cl.
*H01L 23/373* (2006.01)
*H01L 21/02* (2006.01)
(Continued)

(52) U.S. Cl.
CPC .... *H01L 23/3732* (2013.01); *H01L 21/02008* (2013.01); *H01L 21/566* (2013.01);
(Continued)

(58) Field of Classification Search
CPC .... H01L 23/3732; H01L 24/80; H01L 23/291
See application file for complete search history.

(56) References Cited

U.S. PATENT DOCUMENTS 5,371,407 A * 12/1994 Goldman ............ H01L 23/3732
257/713
H1471 H 8/1995 Braun et al.
(Continued)

FOREIGN PATENT DOCUMENTS

CN 107534019 A 1/2018
JP 5374831 B2 12/2013
(Continued)

OTHER PUBLICATIONS

U.S. Office Action for U.S. Appl. No. 17/675,948, dated Nov. 9, 2023.
(Continued)

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A method to form a first diamond composite wafer, a second diamond composite wafer or a third diamond composite wafer with a predetermined diameter includes the following steps: preparing a plurality of diamond blocks, wherein each diamond block has a dimension smaller than the predetermined diameter; attaching the plurality of diamond blocks to a first semiconductor substrate with the predetermined diameter to form a first temporary composite wafer, wherein a thermal conductivity of the first semiconductor substrate is smaller than that of the diamond block; and filling gaps among the plurality of diamond blocks of the first temporary composite wafer to form the first diamond composite wafer; or attaching the first diamond composite wafer to a second semiconductor substrate with the predetermined diameter to form the second diamond composite wafer, or removing the first semiconductor substrate from the first diamond composite wafer to form the third diamond composite wafer.

25 Claims, 21 Drawing Sheets

(51) Int. Cl.

| | |
|---|---|
| *H01L 21/56* | (2006.01) |
| *H01L 21/683* | (2006.01) |
| *H01L 23/00* | (2006.01) |
| *H01L 23/29* | (2006.01) |
| *H01L 23/31* | (2006.01) |
| *H01L 23/367* | (2006.01) |
| *H01L 23/473* | (2006.01) |
| *H01L 23/48* | (2006.01) |
| *H01L 25/065* | (2023.01) |

(52) U.S. Cl.

CPC ........ *H01L 21/6836* (2013.01); *H01L 23/291* (2013.01); *H01L 23/298* (2013.01); *H01L 23/3185* (2013.01); *H01L 23/367* (2013.01); *H01L 23/473* (2013.01); *H01L 23/481* (2013.01); *H01L 24/05* (2013.01); *H01L 24/08* (2013.01); *H01L 24/80* (2013.01); *H01L 25/0657* (2013.01); *H01L 2224/05644* (2013.01); *H01L 2224/05687* (2013.01); *H01L 2224/05691* (2013.01); *H01L 2224/08145* (2013.01); *H01L 2224/08225* (2013.01); *H01L 2224/80006* (2013.01); *H01L 2224/80895* (2013.01); *H01L 2224/80896* (2013.01); *H01L 2225/06589* (2013.01); *H01L 2924/1011* (2013.01); *H01L 2924/10253* (2013.01); *H01L 2924/10254* (2013.01); *H01L 2924/10272* (2013.01); *H01L 2924/1033* (2013.01)

(56) References Cited

U.S. PATENT DOCUMENTS

| | | | |
|---|---|---|---|
| 8,232,137 | B2 | 7/2012 | Gaul et al. |
| 9,735,130 | B2 | 8/2017 | Pan et al. |
| 10,862,196 | B2 | 12/2020 | Haridas et al. |
| 10,885,684 | B2 | 1/2021 | Gubbins et al. |
| 2010/0008620 | A1 | 1/2010 | Chang et al. |
| 2014/0117564 | A1 | 5/2014 | Yu et al. |
| 2014/0141595 | A1 | 5/2014 | Babic et al. |
| 2015/0140740 | A1* | 5/2015 | Moldovan ................ C25D 1/04 |
| | | | 438/122 |
| 2016/0233142 | A1* | 8/2016 | Xu ...................... H01L 23/3732 |
| 2017/0162467 | A1 | 6/2017 | Ellis |
| 2021/0183936 | A1 | 6/2021 | Lee |
| 2021/0249511 | A1 | 8/2021 | Lee |
| 2023/0317443 | A1 | 10/2023 | Tong et al. |

FOREIGN PATENT DOCUMENTS

| | | | |
|---|---|---|---|
| TW | 201104834 | A1 | 2/2011 |
| TW | 201327740 | A1 | 7/2013 |
| TW | 201419507 | A | 5/2014 |
| TW | 202205367 | A | 2/2022 |

OTHER PUBLICATIONS

Taiwanese Office Action and Search Report for Taiwanese Application No. 112129374, dated Apr. 29, 2024.

Taiwanese Office Action and Search Report for Taiwanese Application No. 112129764, dated Mar. 27, 2024.

U.S. Office Action for U.S. Appl. No. 17/675,948, dated May 9, 2024.

Taiwanese Office Action for Taiwanese Application No. 111142200, dated Dec. 25, 2023.

U.S. Office Action for U.S. Appl. No. 17/675,948, dated May 8, 2025.

U.S. Office Action for U.S. Appl. No. 18/231,547, dated Oct. 31, 2025.

* cited by examiner

200
D1    110    120    110
100
230
D2
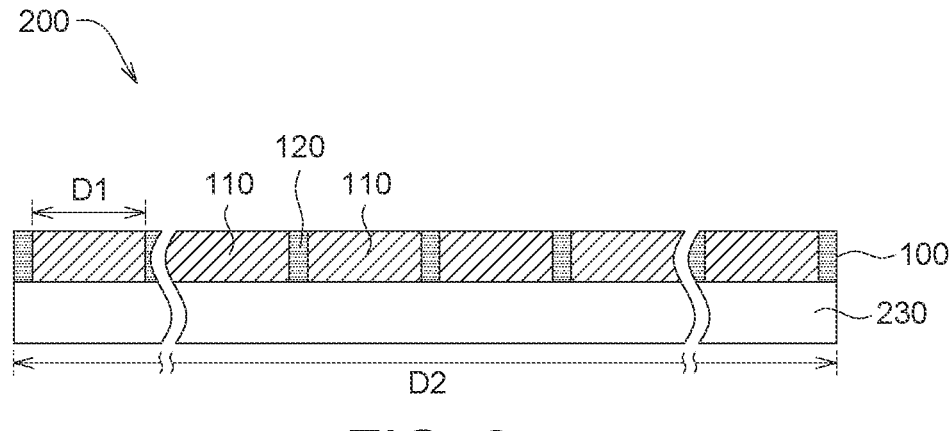
FIG. 2
300
G1    120    110    110
330
200
230
D2
FIG. 3
400
120  110
330
G1
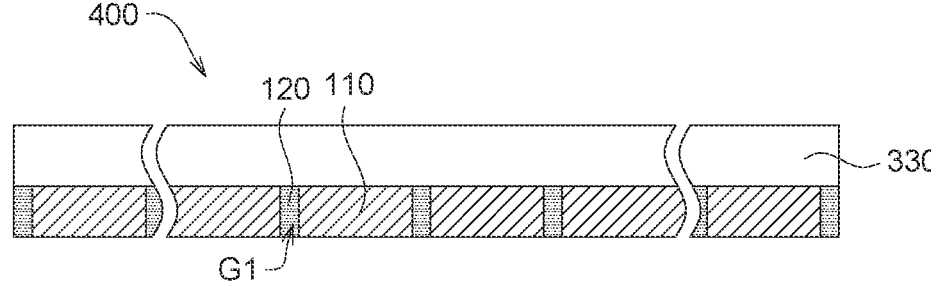
FIG. 4

1400

1301
1102
1102
1102

1500

1301
1102  }1400'
1203
1102
1203
1102
1203

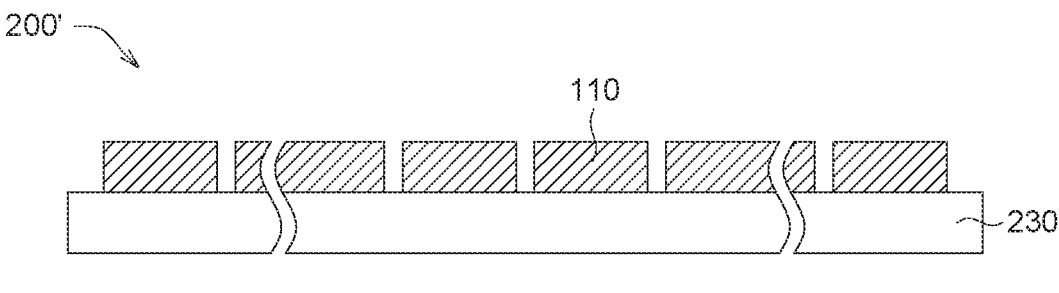
FIG. 16D
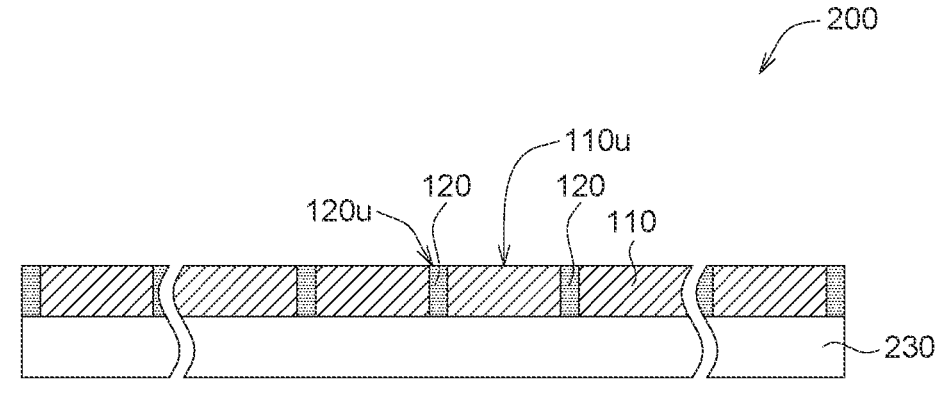
FIG. 16E
FIG. 16F

FIG. 19A                    FIG. 19B

MANUFACTURING METHOD OF DIAMOND COMPOSITE WAFER

This application claims the benefit of U.S. provisional application Ser. No. 63/395,887, filed Aug. 8, 2022, the disclosures of which are incorporated by reference herein in its entirety.

TECHNICAL FIELD

The disclosure relates in general to a manufacturing method of a diamond composite wafer.

BACKGROUND

The advent of 5G and AI has spurred a plethora of new end use applications in 3 Cs, namely, data centers (i.e., cloud), base stations (i.e., connectivity) and commercial/edge electronics (i.e., client/edge), leading to high semiconductor growth and an exponential growth in data communication. According to Cisco Global Cloud Index, the annual global data center IP traffic will surpass an astounding 20 zettabytes ($20 \times 10^{21}$ bytes) by 2021, which was >3× growth from 6.8 zettabytes for 2016. Semiconductor devices that target the high-performance computing (HPC), data center and artificial intelligence (AI) markets have always represented the prevalent state-of-the-art when it comes to integrated circuits (ICs) and IC packaging technologies. The same also holds true for high-end smart handheld applications.

The skyrocketing data traffic demands advanced ICs, particularly processors and memories, and advanced system-in-a-package (SiP) packaging in the extreme for high HPC, data centers, AI, high-end smart handheld and 5G/6G applications. This, in turn, has propelled the following four industry disruptions covering IC, package and system levels which are taking place simultaneously: (a) from ever-larger processor system-on-chip (SoC) die to disaggregated small die based chiplets-in-SiP, (b) from traditional computing to near-memory computing to in-memory computing to reduce the memory wall between processor and memory at the system level in order to more fully exploit the processor performance potentials; (c) from copper interconnect to optical interconnect, and (d) from advanced organic laminate substrate to silicon interposer and hybrid substrates with embedded active and passive devices. SoC is an IC that integrates all or most components of a computer including almost always a central processing unit (CPU), memory, input/output ports and secondary storage, whereas SiP is defined an IC package containing more than one active device such as an IC or a MEMS (micro-electromechanical system). Extreme advanced SiP packaging of high-end processors and memories with fanout (for smart handhelds), 2.5D IC, 3D IC, embedded SiP and silicon photonics in particular has been and will continue to be the primary enabler of all four disruptions as well as continuation of IC performance advancement for advanced IC applications covering 3 Cs, leading to unprecedented levels of heterogeneous integration at the IC, package and system levels going forward.

In order to deliver ever-higher performance to process the exponential increase in data traffic, processor chip power at data centers is expected to grow 5 times from 2018 to 2025, reaching 1000 W per chip with chips packaged in 2.5D IC, 3D IC and/or chiplets-in-SiP platforms. Certain AI applications such as Cerebra's 8"×8" wafer-scale AI processor chip, the largest SoC ever built, already consumes an astounding 15 KW per chip. According to an article published in Nature, "How to Stop Data Centers from Gobbling up the World's Electricity" (Sep. 12, 2018), the energy consumption of data centers and communication networks to 17% of total electricity demand worldwide by 2030. Data center power consumption and related chips' thermal management is expected to continue to limit the full potential of the cloud and 5G/6G digital world/economy applications as the industry struggles with power and cooling (by, for example, air, direct-to-chip cooling and/or immersion). In addition to escalating power consumption, data center power density requirements continue to increase year after year. The average rack power density is currently around 7-16 k W. With HPC and data centers, power densities may reach 100 k W per rack.

Data centers is maxing out on how much heat they may dissipate for applications such as servers (note: servers, for instance, drive 40 percent of the power used in data centers), network interface cards (NICs), and fiber-optic transceivers, as well as on the trade-offs between switching speed and power efficiency. Power management also presents a challenge for small devices requiring extremely high densities such as optical transceivers (and silicon photonics) as power supplies are bulky and too far away from them due to their large sizes.

SUMMARY

According to an embodiment, a method to form a first diamond composite wafer, a second diamond composite wafer or a third diamond composite wafer with a first predetermined diameter includes the following steps: (a) preparing a plurality of diamond blocks, wherein a dimension of each diamond block is smaller than the first predetermined diameter; attaching the plurality of diamond blocks to a first semiconductor substrate with the first predetermined diameter to form a first temporary composite wafer, wherein a thermal conductivity of the first semiconductor substrate is smaller than that of the diamond block; and filling gaps among the plurality of diamond blocks of the first temporary composite wafer to form the first diamond composite wafer; or attaching the first diamond composite wafer to a second semiconductor substrate with the first predetermined diameter to form the second diamond composite wafer, or removing the first semiconductor substrate from the first diamond composite wafer to form the third diamond composite wafer.

According to another embodiment, a method to form a first diamond composite wafer, a second diamond composite wafer, a third diamond composite wafer or a fourth diamond composite wafer with a first predetermined diameter, includes the following steps: (a) attaching a plurality of diamond blocks and a plurality of semiconductor blocks to a first temporary carrier with the first predetermined diameter to form a first temporary composite wafer, wherein both a dimension of each diamond block and a dimension of each semiconductor block are smaller than the first predetermined diameter, and a thermal conductivity of the semiconductor block is smaller than that of the diamond block; and filling gaps among the plurality of diamond blocks and gaps among the plurality of semiconductor blocks, and removing the first temporary carrier to form the fourth diamond composite wafer; or attaching the fourth diamond composite wafer to a first semiconductor substrate with the first predetermined diameter to form the second diamond composite wafer; or removing the plurality of semiconductor blocks from the second diamond composite wafer to form the first diamond composite wafer; or removing the plurality of semiconductor blocks from the fourth diamond composite wafer to form the third diamond composite wafer.

According to another embodiment, a method to form a first diamond composite IC wafer or a second diamond composite IC wafer, includes the following steps: (a) preparing a first semiconductor wafer with a first predetermined diameter, wherein the first semiconductor wafer includes a set of IC circuits on a first side of the first semiconductor wafer; (b) preparing a plurality of diamond blocks or a diamond wafer with the first predetermined diameter; and (c) bonding the plurality of diamond blocks to the first semiconductor wafer, and filling gaps among the plurality of diamond blocks to form the first diamond composite IC wafer; or bonding the diamond wafer to the first semiconductor wafer to form the second diamond composite IC wafer.

The above and other aspects of the disclosure will become better understood with regard to the following detailed description of the preferred but non-limiting embodiment (s). The following description is made with reference to the accompanying drawings.

BRIEF DESCRIPTION OF THE DRAWINGS

FIG. 2 is a cross-sectional view of a schematic diagram of a diamond composite wafer according to another embodiment of the present disclosure;

FIG. 3 is a schematic diagram of a cross-sectional view of a diamond composite wafer according to another embodiment of the present disclosure;

FIG. 4 is a schematic diagram of a cross-sectional view of a diamond composite wafer according to another embodiment of the present disclosure;

4

Figure 5:
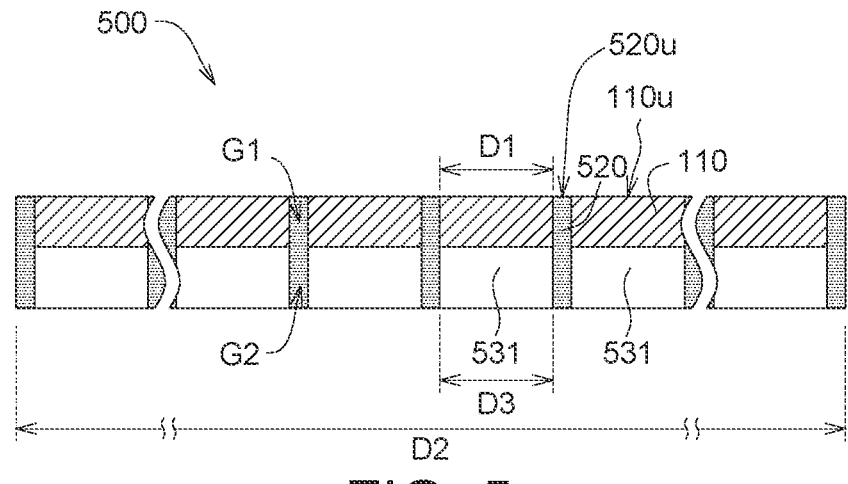
FIG. 5 is a schematic diagram of a cross-sectional view of a diamond composite wafer according to another embodiment of the present disclosure.
Figure 9:
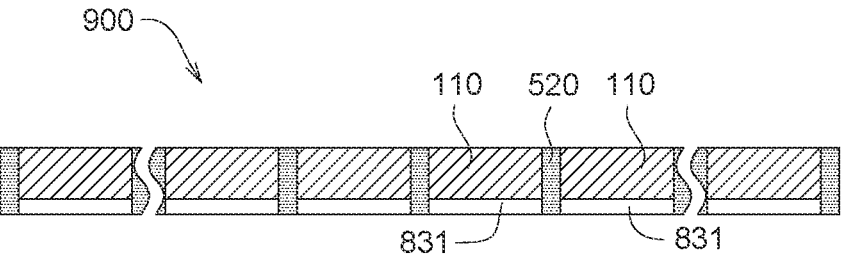
FIG. 9 is a schematic diagram of a cross-sectional view of a diamond composite wafer according to another embodiment of the present disclosure.
Figure 12:
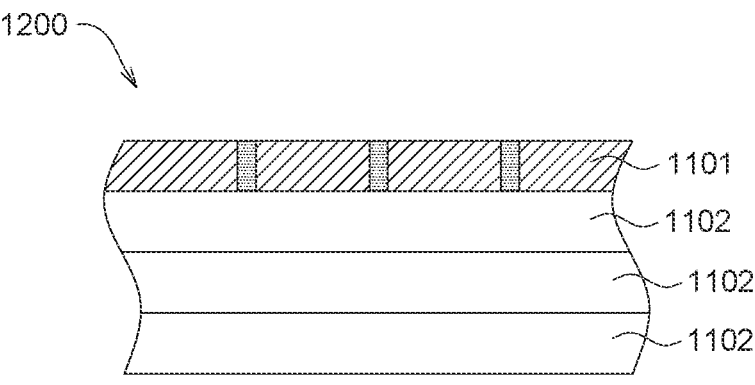
FIG. 12 is a schematic diagram of a cross-sectional view of a diamond composite IC wafer according to another embodiment of the present disclosure.
Figure 13:
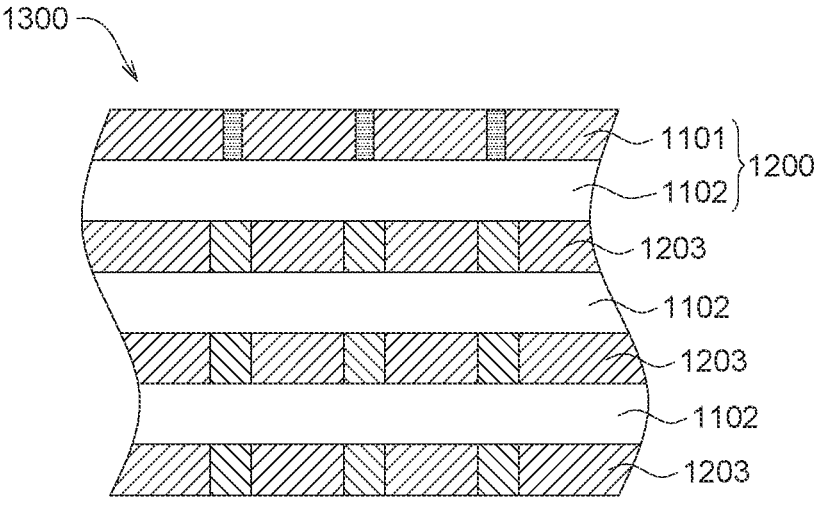
FIG. 13 is a schematic diagram of a cross-sectional view of a diamond composite IC wafer according to another embodiment of the present disclosure.
Figure 14:
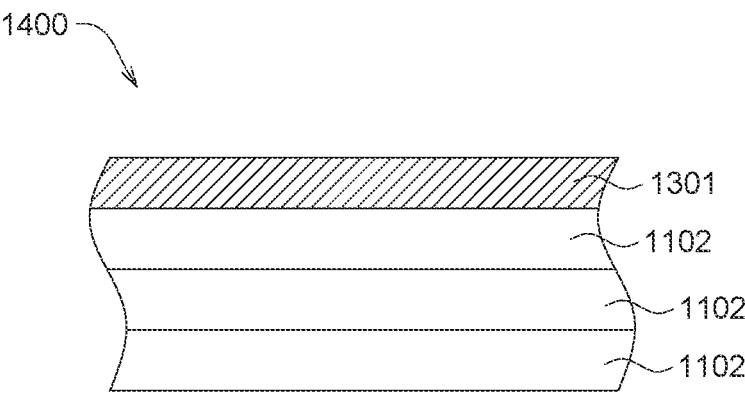
Figure 15:
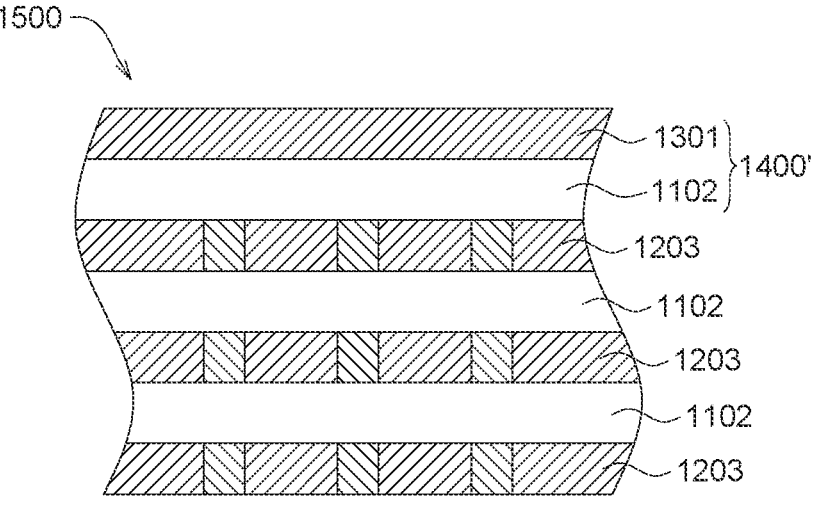
Figure 21A:
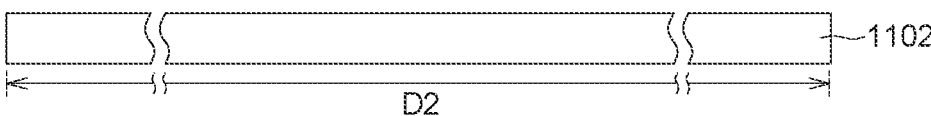
Figure 21B:
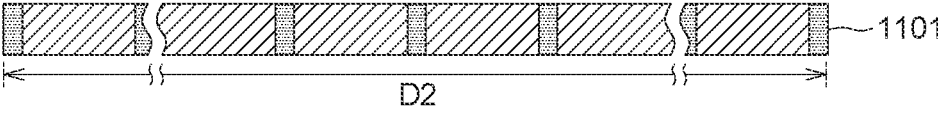
Figure 21C:
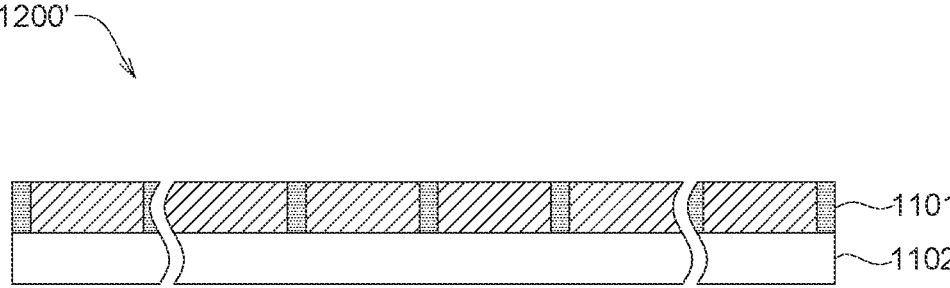
Figure 22A:
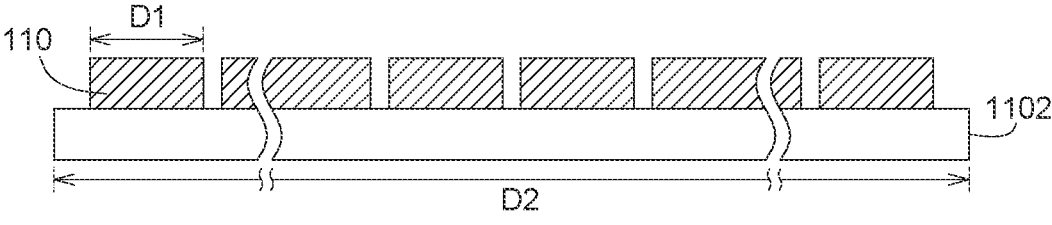
Figure 22B:
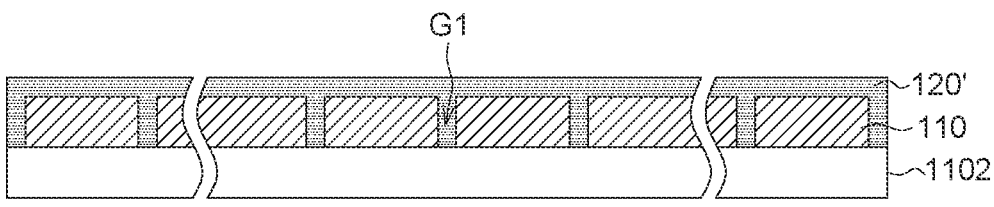
Figure 22C:
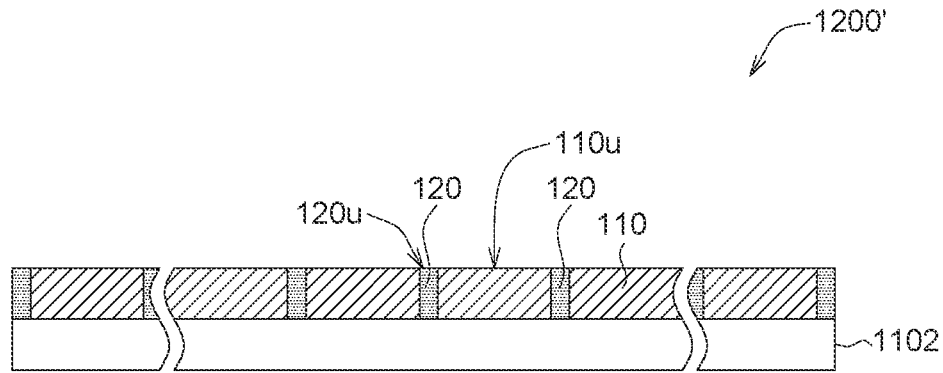
Figure 23A:
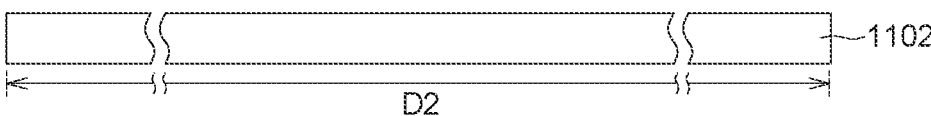
Figure 23B:
Figure 23C:
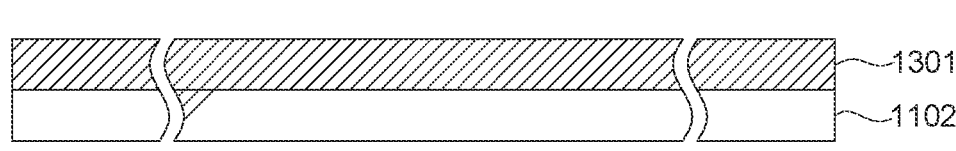

FIG. 14 is a schematic diagram of a cross-sectional view of a diamond composite IC wafer according to another embodiment of the present disclosure;

FIG. 15 is a schematic diagram of a cross-sectional view of a diamond composite IC wafer according to another embodiment of the present disclosure;

FIGS. 16A to 16F are schematic diagrams of manufacturing processes of the diamond composite wafer of FIG. 2 according to an embodiment of the present disclosure;

FIGS. 17A to 17D are schematic diagrams of manufacturing processes of the diamond composite wafer of FIG. 5 according to an embodiment of the present disclosure;

FIGS. 18A to 18H are schematic diagrams of manufacturing processes of the diamond composite wafer of FIG. 5 according to another embodiment of the present disclosure;

FIGS. 19A to 19E are schematic diagrams of manufacturing processes of the diamond composite wafer of FIG. 9 according to an embodiment of the present disclosure;

FIGS. 20A to 20J are schematic diagrams of manufacturing processes of the diamond composite wafer of FIG. 9 according to another embodiment of the present disclosure;

FIGS. 21A to 21C are schematic diagrams of manufacturing processes of the diamond composite IC wafer of FIG. 12 according to an embodiment of the present disclosure;

FIGS. 22A to 22C are schematic diagrams of manufacturing processes of the diamond composite IC wafer of FIG. 12 according to another embodiment of the present disclosure; and FIGS. 23A to 23C are schematic diagrams of manufacturing processes of the diamond composite IC wafer of FIG. 13 according to another embodiment of the present disclosure.

In the following detailed description, for purposes of explanation, numerous specific details are set forth in order to provide a thorough understanding of the disclosed embodiments. It will be apparent, however, that one or more embodiments could be practiced without these specific details. In other instances, well-known structures and devices are schematically shown in order to simplify the drawing.

DETAILED DESCRIPTION

This invention discloses methodologies, processes and structures to create the aforementioned full-sized composite wafers starting from a diamond substrate which is smaller than 8" in diameter. What this invention achieves is at least: fill the large size gaps between diamond, and both silicon (or silicon-on-insulator) and silicon carbide, SiC (gallium nitride, GaN) through the creation of full-sized diamond based composite wafers (covering a diamond bi-wafer, a diamond tri-wafer and a diamond wafer) via heterogeneous integration of advanced packaging, wafer back-end-of-the-line (BEOL) and MEMS technologies. There also exist a large variety of other material combinations that can lead to the formation of composite wafers using the methodologies, processes and structures disclosed herein.

Although examples will be shown based primarily on the creation of diamond composite wafers for the fabrication of advanced ICs and advanced (multi-chip) SiPs for HPC, data centers and AI applications, the invention disclosed herein may also be applied to other types of single-chip and multi-die packages for other applications as warranted including power electronics, passive devices, MEMS, nano-electromechanical systems (NEMSs), SCD resonators, lasers and optics, silicon photonics, lateral high-mobility FETs (field effect transistors), vertical Schottky barrier diode devices, quantum memory, and (room-temperature) quantum computers.

For HPC, data center and AI applications, diamond enabled advanced ICs and advanced SiPs may be implemented in conjunction with liquid cooling. Air cooling is running out of steam for very energy intensive data centers. Conventional air-cooled chips with finned metal heatsinks and small fans may support up to 400 W. High-performance chips generate far more heat and far higher heat densities than conventional chips, peaking in small hot spots inside them that may damage the delicate circuitry if not cooled properly. Liquid cooling is already making inroads into data centers. Cooling with liquids, water included, could be 3-4 times more efficient than air cooling. Advanced cooling technologies like direct-to-chip cooling using cold plates and direct liquid immersion cooling may play a key role in future hyperscale data center cooling as chip power continues to increase. Implementation of immersion cooled systems require a dramatically different eco-system and many more hurdles need to be overcome compared to indirect cooling before immersion cooling becomes economically viable. Immersion cooling uses a leak-proof bath of dielectric fluid to submerge the full hardware. In both direct-to-chip cooling and immersion cooling, the liquid or fluid absorbs the heat, in some cases cools and condenses, and returns back as fluid to the bath.

The methodologies, processes and structures disclosed herein on the creation of diamond based composite wafers for the fabrication of diamond enabled advanced ICs and advanced SiPs may be combined with new cooling methods such as direct-to-chip liquid cooling and immersion cooling to maximize cooling effectiveness and efficiencies and to scale with rising chip power and liquid chip cooling trends.

Figure 1A:
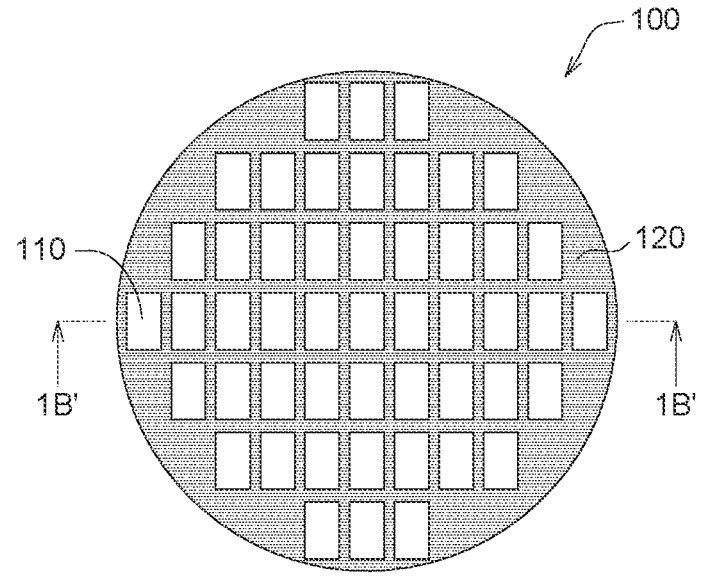
FIG. 1A is a schematic diagram of a diamond composite wafer 100 according to an embodiment of the present disclosure.
Figure 1B:
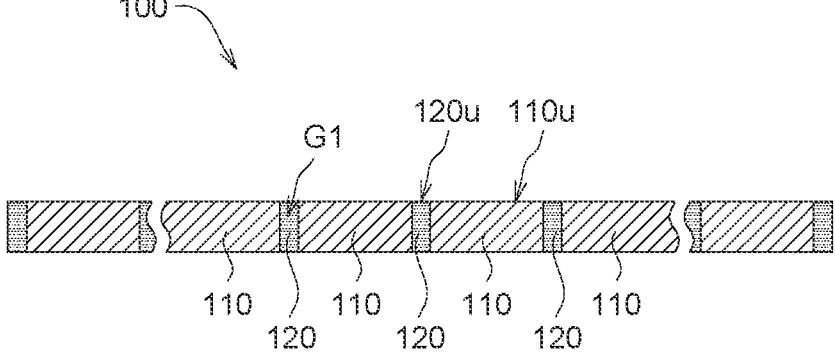
FIG. 1B is a schematic diagram of a cross-sectional view of the diamond composite wafer of FIG. 1A in a direction 1B-1B'.

Referring FIGS. 1A and 1B, FIG. 1A is a schematic diagram of a diamond composite wafer 100 according to an embodiment of the present disclosure, and FIG. 1B is a schematic diagram of a cross-sectional view of the diamond composite wafer 100 of FIG. 1A in a direction 1B-1B'. The diamond composite wafer 100 includes a plurality of diamond blocks 110 and a plurality of spacers 120 (such as molding compound or filler). Each spacer 120 fills a gap G1 between two adjacent diamond blocks 110. In another example, the spacers 120 may be connected as a continuous structure, as shown in FIG. 1A.

Each diamond block 110 is formed of, diamond. Diamond possesses a unique combination of extreme properties: (1) thermal conductivity (W/cm·° K): about 24 vs. about 4 for copper, about 1.5 for silicon, about 3 for GaN and about 5 for SiC-4H; (2) breakdown field (MV/cm): about 20 vs. about 0.3 for silicon, about 5 for GaN and about 3 for SiC-4H; (3) electron mobility (cm$^2$/Vs): about 4,500 vs. about 1,450 for silicon, about 440 for GaN and about 900 for SiC-4H; (4) hole mobility (cm$^2$/Vs): about 3,800 vs. about 480 for silicon, about 200 for GaN and about 120 for SiC-4H; (5) band gap (eV): about 5.5 vs. about 3.44 for GaN and about 3.2 for SiC-4H; (6) broadband optical transparency: from about 230 nm to about 15 μm to about 1 mm; (7) coefficient of thermal expansion: about 0.7 ppm/° C.; (8) hardness (about 10 by Mohs, highest), wear resistance and chemically inertness.

Diamond has the highest thermal conductivity of any known material at temperatures above 100 K which is five times that of copper. Diamond also comes with high electrical resistivity (diamond may insulate high voltages across much thinner layers of material) and high electrical breakdown field. Diamond has a very low coefficient of thermal expansion. Semiconducting diamond's electronic band gap is bigger than silicon, and the two mainstream wide-band-gap materials, SiC and GaN for power electronics. Diamond is transparent from the UV (230 nm) to the far infrared. Only minor absorption bands exist between 2.5 and 6 μm (that result from two phonon absorption). Diamond is an ideal material for multispectral optical applications. Diamond is extremely hard, wear resistant and chemically inert. It is an ideal material for hostile, highly erosive atmospheres.

Single crystal diamond (SCD) is the ultimate material for high voltage, high temperature, and high frequency applications. For silicon-diamond composite wafers to be practical for HPC and other high-power applications, it is best that these wafers are to 12" in diameter, the largest wafer size in mainstream IC fabrication and advanced SiP wafer-level processes today, for productivity and cost reasons. By the same token, 8" SiC-diamond composite wafers are preferred for SiC applications as SiC wafers are available commercially in 8".

Despite significant progress made in the recent past in growing larger, high-quality diamond wafers/plates, diamond could be grown commercially to a size/diameter of about 145 mm in terms of polycrystalline Diamond (PCD), and is available in the form of 50 mm×50 mm high-quality SCD plates, both up to 0.5 mm thick. These sizes are still much smaller than 12", required by 12" silicon-diamond composite wafers, and smaller than 8" required by 8" SiC-diamond composite wafers.

In addition, the diamond block 110 can have a size (viewed from FIG. 1A) of 6 millimeter (mm)×7 mm for die, while having a size (viewed from FIG. 1A) of 40 mm×50 mm for interposer. In addition, the diamond block 110 can have a size (viewed from FIG. 1A) of 2 inches×2 inches for SCD, while having a size (viewed from FIG. 1A) of 5 inches×5 inches for PCD.

In an embodiment, the spacer 120 may be formed of a material including, for example, filler, molding compound, etc. Filler candidates include diamond, silicon dioxide (SiO$_2$), silicon nitride (Si$_3$N$_4$), spin-on-glass (SOG), and poly-silicon. The molding compound includes materials such as a Novolac-based resin, an epoxy-based resin, a silicone-based resin, or another suitable encapsulant, and may contain suitable fillers such as powdered SiO$_2$. The molding compound may be formed by using, for example, transfer molding, compression molding, etc.

As shown in FIG. 1B, the spacer 120 has an upper surface 120$u$, and the diamond block 110 has an upper surface 110$u$, wherein the upper surface 110$u$ and the upper surface 120$u$ flush with each other.

FIG. 2 is a cross-sectional view of a schematic diagram of a diamond composite wafer 200 according to another embodiment of the present disclosure. The diamond composite wafer 200 includes a plurality of the diamond blocks 110, a plurality of the spacers 120 and a first semiconductor substrate 230. In the present embodiment, the diamond composite wafer 100 of FIG. 1 and the first semiconductor substrate 230 are connected to form the diamond composite wafer 200. A thermal conductivity of the first semiconductor substrate 230 is smaller than that of the diamond block 110.

As shown in FIG. 2, each diamond block 110 has a dimension D1, and the first semiconductor substrate 230 has a predetermined diameter D2, wherein the dimension D1 is smaller than the predetermined diameter D2. The predetermined diameter D2 may be, for example, 12 inches, and the first semiconductor substrate 230 is silicon substrate, for example, silicon wafer. In another embodiment, the predetermined diameter D2 is 8 inches, and the first semiconductor substrate 230 is SiC substrate.

FIG. 3 is a schematic diagram of a cross-sectional view of a diamond composite wafer 300 according to another embodiment of the present disclosure. The diamond composite wafer 300 includes a plurality of the diamond blocks 110, a plurality of the spacers 120, the first semiconductor substrate 230 and a second semiconductor substrate 330. Each spacer 120 fills the gap G1 between the two adjacent diamond blocks 110. In the present embodiment, the diamond composite wafer 200 of FIG. 2 and the second semiconductor substrate 330 are connected to form the diamond composite wafer 300.

The second semiconductor substrate 330 has the predetermined diameter D2. In the present embodiment, the predetermined diameter D2 may be, for example, 12 inches. The second semiconductor substrate 230 is silicon substrate, for example, silicon wafer. In another embodiment, the predetermined diameter D2 is 8 inches, and the second semiconductor substrate 330 is SiC substrate.

FIG. 4 is a schematic diagram of a cross-sectional view of a diamond composite wafer 400 according to another embodiment of the present disclosure. The diamond composite wafer 400 includes a plurality of the diamond blocks 110, a plurality of the spacers 120 and the second semiconductor substrate 330. Each spacer 120 fills the gap G1 between the two adjacent diamond blocks 110. In the present embodiment, the diamond composite wafer 400 includes the features the same as or similar to that of the diamond composite wafer 300 except that, for example, the diamond composite wafer 400 may omit the first semiconductor substrate 230 of the diamond composite wafer 300.

FIG. 5 is a schematic diagram of a cross-sectional view of a diamond composite wafer 500 according to another embodiment of the present disclosure. The diamond composite wafer 500 includes a plurality of the diamond blocks 110, a plurality of the spacers 520 and a plurality of semiconductor blocks 531. Viewed from top of the diamond composite wafer 500, the spacers 520 may be connected as a continuous structure.

As shown in FIG. 5, each spacer 520 fills the gap G1 between the two adjacent diamond blocks 110 and a gap G2 between the two adjacent semiconductor blocks 531. In an embodiment, the gap G1 may be equal to, greater than or smaller than the gap G2. The spacer 520 is formed of a material the same as or similar to that of the spacer 120. In addition, the diamond block 110 has the dimension D1 and the semiconductor block 531 has a dimension D3, wherein the dimension D3 of the semiconductor block 531 is smaller than, greater than or equal to the dimension D1 of the diamond block 110. The dimension D1 and the dimension D3 are smaller than the predetermined diameter D2. A thermal conductivity of the semiconductor block 531 may be smaller than that of the diamond block 110.

As shown in FIG. 5, each spacer 520 has an upper surface 520$u$, and the diamond block 110 has the upper surface 110$u$, wherein the upper surface 110$u$ and the upper surface 520$u$ flush with each other.

Figure 6:
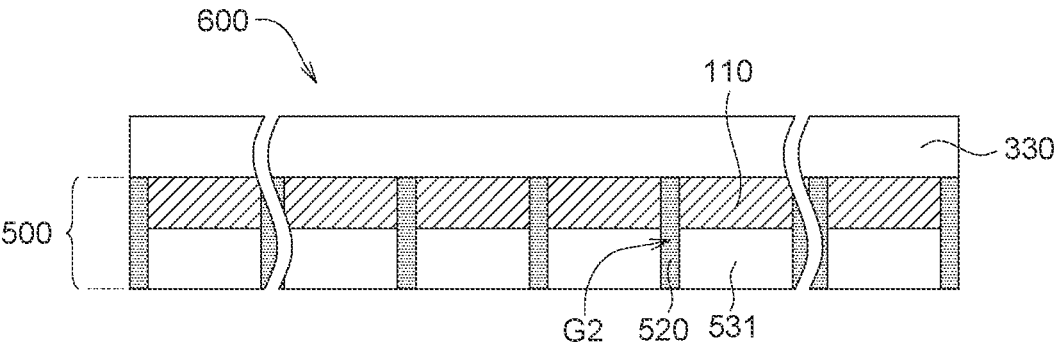
FIG. 6 is a schematic diagram of a cross-sectional view of a diamond composite wafer according to another embodiment of the present disclosure.

FIG. 6 is a schematic diagram of a cross-sectional view of a diamond composite wafer 600 according to another embodiment of the present disclosure. The diamond composite wafer 600 includes the diamond composite wafer 500 and the second semiconductor substrate 330 attached to the diamond composite wafer 500. In the present embodiment, the diamond composite wafer 600 includes features the same as or similar to that of the diamond composite wafer 500 except that, for example, the diamond composite wafer 600 further includes the second semiconductor substrate 330 connected to the diamond composite wafer 500.

Figure 7:
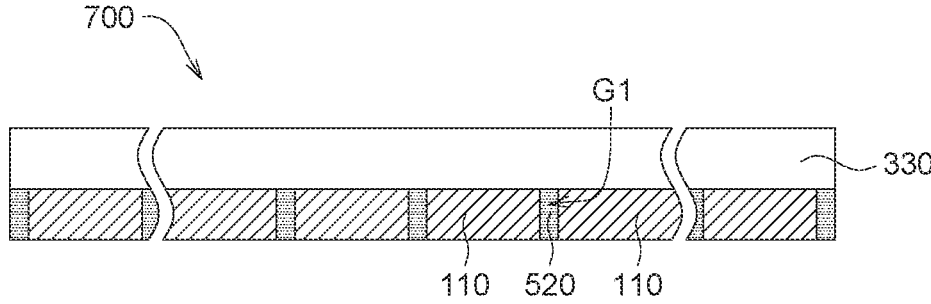
FIG. 7 is a schematic diagram of a cross-sectional view of a diamond composite wafer according to another embodiment of the present disclosure.

FIG. 7 is a schematic diagram of a cross-sectional view of a diamond composite wafer 700 according to another embodiment of the present disclosure. The diamond composite wafer 700 includes a plurality of the diamond blocks 110, a plurality of the spacers 520 and the second semiconductor substrate 330. In the present embodiment, the diamond composite wafer 700 includes the features the same as or similar to that of the diamond composite wafer 600 except that, for example, the diamond composite wafer 700 may omit the semiconductor blocks 531 and a portion of the spacer 520 within the gap G2 of FIG. 6.

Figure 8:
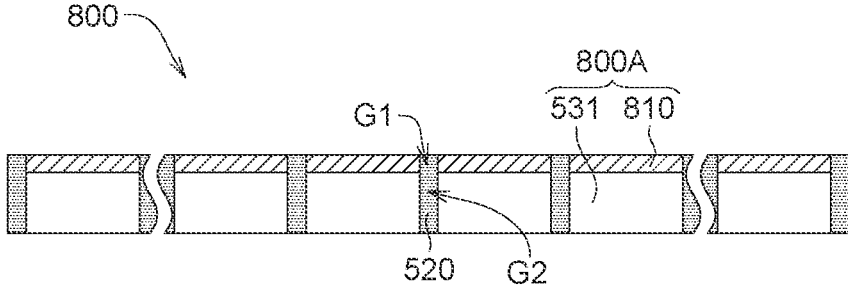
FIG. 8 is a schematic diagram of a cross-sectional view of a diamond composite wafer according to another embodiment of the present disclosure.

FIG. 8 is a schematic diagram of a cross-sectional view of a diamond composite wafer 800 according to another embodiment of the present disclosure. The diamond composite wafer 800 includes a plurality of composite blocks 800A and a plurality of the spacers 520. Each composite block 800A includes a diamond layer 810 and the semiconductor block 531, wherein each diamond layer 810 is formed on the corresponding semiconductor block 531. Each spacer 520 fills the gap G1 between the two adjacent diamond layers 810 and the gap G2 between the two adjacent semiconductor blocks 531. In the present embodiment, the diamond block 810 may be formed using deposition, for example, chemical vapor deposition (CVD).

FIG. 9 is a schematic diagram of a cross-sectional view of a diamond composite wafer 900 according to another embodiment of the present disclosure. The diamond composite wafer 900 includes a plurality of the diamond blocks 110, a plurality of the spacers 520 and a plurality of silicon layers 831. Each silicon layer 831 is formed on the corresponding diamond block 110.

The silicon layer 831 may be a portion of a silicon-on-insulator (SOI) wafer. The SOI wafer includes a bulk silicon, a silicon oxide ($SiO_2$) layer and a silicon layer 831, wherein the silicon oxide layer is formed between the bulk silicon and the silicon layer 831. Before or after the SOI wafer is connected to the diamond block 110, the bulk silicon and the silicon oxide layer may be removed. In an embodiment, the silicon layer 831 is a thin layer having a thickness ranging between around 100 nm to a few micrometers.

Figure 10:
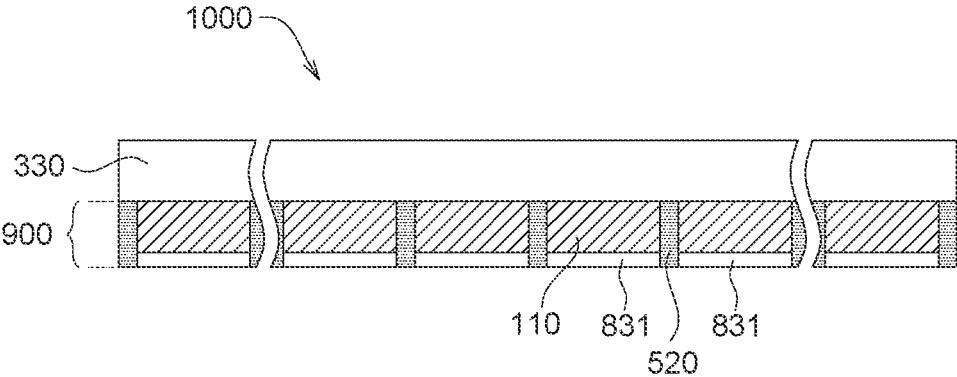
FIG. 10 is a schematic diagram of a cross-sectional view of a diamond composite wafer according to another embodiment of the present disclosure.

FIG. 10 is a schematic diagram of a cross-sectional view of a diamond composite wafer 1000 according to another embodiment of the present disclosure. The diamond composite wafer 900 includes a plurality of the diamond blocks 110, a plurality of the spacers 520, a plurality of silicon layers 831 and the second semiconductor substrate 330. In the present embodiment, the second semiconductor substrate 330 and the diamond composite wafer 900 of FIG. 9 are connected to each other.

Figure 11:
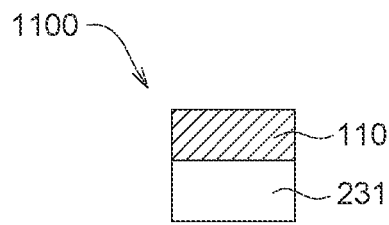
FIG. 11 is a schematic diagram of a cross-sectional view of a diamond composite sub-assembly according to another embodiment of the present disclosure.

FIG. 11 is a schematic diagram of a cross-sectional view of a diamond composite sub-assembly 1100 according to another embodiment of the present disclosure. The diamond composite sub-assembly 1100 includes one diamond block 110 and one semiconductor block 231 connected to the diamond block 110.

In another embodiment, the diamond composite wafer may include one diamond block 110 and one semiconductor block 831 of FIG. 9 connected to the diamond block 110, or include one diamond layer 810 of FIG. 8 and one semiconductor block 531 connected to the diamond layer 810, or include one diamond block 110 and one semiconductor block 531 of FIG. 6 connected to the diamond block 110.

FIG. 12 is a schematic diagram of a cross-sectional view of a diamond composite IC wafer 1200 according to another embodiment of the present disclosure. The diamond composite IC wafer 1200 includes a diamond composite wafer 1101 and at least one first semiconductor substrate 1102. A plurality of the first semiconductor substrates 1102 are connected to each other by micro-bump or hybrid bond, and the diamond composite wafer 1101 and one of the first semiconductor substrates 1102 are connected to each other. The diamond composite wafer 1101 includes the structure the same as or similar to that of the diamond composite wafer 100 of FIG. 1B. In the present embodiment, the first semiconductor wafer 1102 is, for example, IC wafer which includes a set of IC circuits on a side of the first semiconductor wafer 1102.

FIG. 13 is a schematic diagram of a cross-sectional view of a diamond composite IC wafer 1300 according to another embodiment of the present disclosure. The diamond composite IC wafer 1300 includes the diamond composite wafer 1101, at least one first semiconductor substrate 1102 and at least one diamond containing interposer 1203. A plurality of the first semiconductor substrates 1102 are connected to a plurality of the diamond containing interposers 1203. For example, one of the first semiconductor substrates 1102 is disposed between the two adjacent diamond containing interposers 1203, or one of the diamond containing interposers 1203 is disposed between the two adjacent first semiconductor substrates 1102. The diamond containing interposer 1203 has the predetermined diameter D2 (not shown). Although not shown, the diamond containing interposer 1203 may include a diamond layer, through diamond vias (TDVs) and a re-distribution layer (RDL) bonded to the diamond composite IC wafer 1200', wherein the diamond composite IC wafer 1200' includes the diamond composite wafer 1101 and at least one first semiconductor substrates 1102.

FIG. 14 is a schematic diagram of a cross-sectional view of a diamond composite IC wafer 1400 according to another embodiment of the present disclosure. The diamond composite IC wafer 1400 includes a diamond wafer 1301 and at least one first semiconductor substrate 1102. A plurality of the first semiconductor substrates 1102 are connected to each other, and the diamond wafer 1301 and one of the first semiconductor substrates 1102 are connected to each other.

FIG. 15 is a schematic diagram of a cross-sectional view of a diamond composite IC wafer 1500 according to another embodiment of the present disclosure. The second diamond composite IC wafer 1500 includes the diamond wafer 1301, at least one first semiconductor substrate 1102 and at least one diamond interposer 1203. A plurality of the first semiconductor substrates 1102 are connected to a plurality of the diamond containing interposers 1203. For example, one of the first semiconductor substrates 1102 is disposed between the two adjacent diamond containing interposers 1203, or one of the diamond containing interposers 1203 is disposed between the two adjacent first semiconductor substrates 1102. Although not shown, the diamond containing interposer 1203 may include a diamond layer, TDVs and a re-distribution layer (RDL) bonded to the diamond composite IC wafer 1400', wherein the first diamond composite IC wafer 1400' includes the diamond wafer 1301 and at least one first semiconductor substrates 1102.

As described above, using a full-sized diamond wafer (for example, the diamond composite wafer 100 of FIG. 1B), a diamond bi-wafer (for example, the diamond composite wafer 200 of FIG. 2), a diamond tri-wafer (for example, the diamond composite wafer 300 of FIG. 3), one may proceed to build complex micro-machined advanced ICs and advanced interposers with redistribution layers (RDL) on both sides (front side, or chip/circuitry side, and backside) of the wafers and Cu filled through-silicon/diamond-vias (TSDVs).

To facilitate seamless advanced IC fabrication and advanced package processing, the overall thickness of the diamond bi-wafer or the diamond tri-wafer in one example preferably could be equal to (but not limited to) the thickness of a standard 12" silicon wafer which is about 775 μm or the thickness (~500 μm) of 8" SiC wafers. The diamond tri-wafer may be used for making thin or ultrathin ICs such as high-bandwidth-memory DRAM (which can be as thin as 30 μm), while the diamond bi-wafer (and even the diamond tri-wafer depending on desired final IC thicknesses and cooling requirements) for processor ICs and 2.5D interposers.

FIGS. 16A to 16F are schematic diagrams of manufacturing processes of the diamond composite wafer 200 of FIG. 2 according to an embodiment of the present disclosure.

Figure 16A:
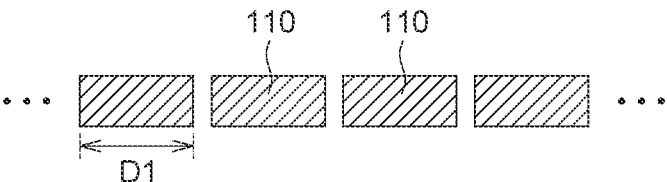
Figure 16B:
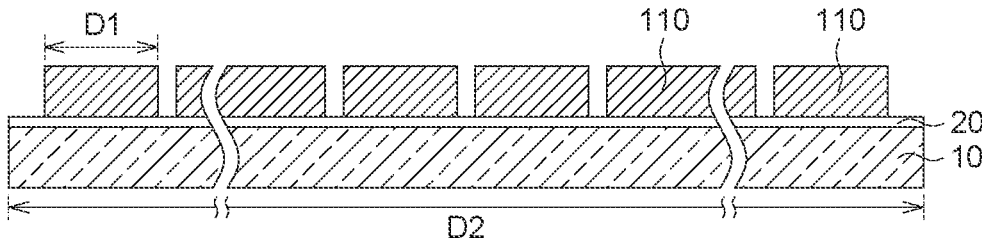
Figure 16C:
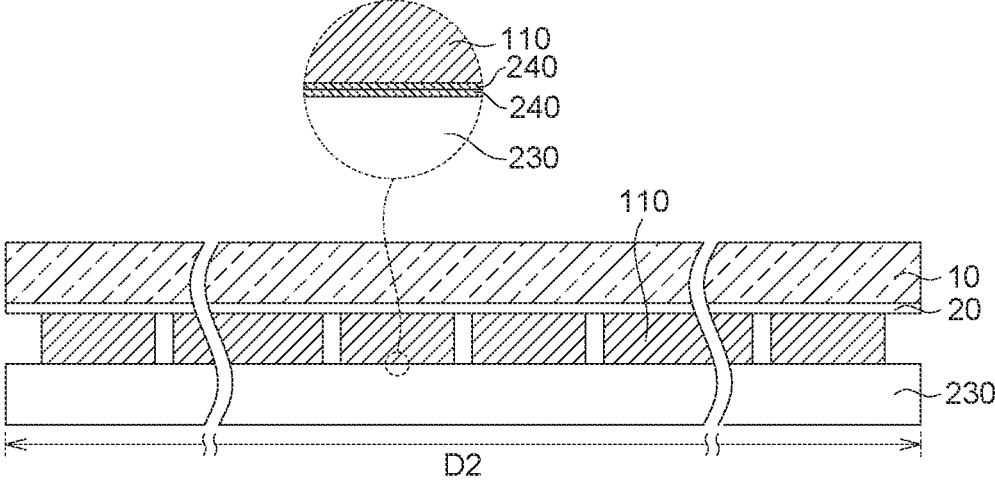

As shown in FIG. 16A, a plurality of the diamond blocks 110 are prepared, wherein each diamond block 110 has the dimension D1 smaller than the predetermined diameter D2 as shown in FIGS. 16B and 16C.

As shown in FIGS. 16B to 16D, the diamond blocks 110 are attached to the first semiconductor substrate 230 (as shown in FIG. 16C) with the predetermined diameter D2 to form a temporary composite wafer 200' (as shown in FIG. 16D), wherein a thermal conductivity of the first semiconductor substrate 230 is smaller than that of each diamond block 110.

Furthermore, as shown in FIG. 16B, the diamond blocks 110 are attached on a temporary carrier 10 with the predetermined diameter D2 by a release layer 20. Then, as shown in FIG. 16C, the diamond blocks 110 which are attached to the temporary carrier 10 are bonded to the first semiconductor substrate 230. Then, as shown in FIG. 16D, the temporary carrier 10 and the release layer 20 are released from the diamond blocks 110 to expose the diamond blocks 110 and to form the temporary composite wafer 200'. In an embodiment, the predetermined diameter D2 may be, for example, 12 inches, and the first semiconductor substrate 230 is silicon substrate, for example, silicon wafer. In another embodiment, the predetermined diameter D2 is 8 inches, and the first semiconductor substrate 230 is SiC substrate.

In an embodiment, before bonding the diamond blocks 110 to the first semiconductor substrate 230, the surfaces of the diamond blocks 110 and the surface of the first semiconductor substrate 230 may be treated, for example, by surface pre-conditioning and activation. The treated surfaces of the diamond blocks 110 are bonded to the treated surface of the first semiconductor substrate 230 with a glue layer 240 (as shown in FIG. 16C) or without the glue 240. The glue layer 240 may be selected from the group consisting of Si (e.g., poly-silicon), $SiO_2$, $Si_3N_4$, $Al_2O_3$ (alumina), diamond, boron nitride, aluminum nitride and graphene; or selected from the group consisting of Ti, W, Pt, Cr, Au, Cu, Ir, nickel (Ni), nickel-vanadium (Ni—V), iron (Fe), Ag—In, Au—In, Ag, Sn, Mo and other types of transient liquid phase bonding metals; or selected from the group consisting of Ir on SrTiO3, Ir on YSZ/Si, Ir on MgO, and sapphire or TaO3, or combinations thereof. In addition, the release layer 20 may be removed with the temporary carrier 10. When coating on the backside of an active IC wafer is involved, a diffusion barrier layer, for example, can be deposited on the wafer backside first. This barrier layer can be Ti, chromium (Cr) or tungsten (W). A stack of Ti, Ti/nickel-vanadium (Ni—V) and Ag can be sputter deposited on Si backside following in-situ sputter etching using argon (Ar) to remove native oxides from the Si backside to prepare the Si for bonding where the Ti layer can serve as the barrier to Ni diffusion towards Si, and the Ni—V layer, a solderable intermediate layer, forms good bonds with soft solders, and the bonding Ag layer protects the underlying layers from oxidation and enables solderability.

The Ti/Ni-V/Ag metal stack can be tailored to achieve low stresses and low wafer warpage which is particularly important for thin ICs commonly found in 3D IC structures by adjusting sputtering conditions. Ag to Ag and Au to Au bonding using a TCB can take place at temperatures below 250° C. Ag and Au have high thermal conductivities at 430 W/m° K, and 320 W/m° K, respectively (versus ~400 W/m° K for copper and 148 W/m° K for silicon) and high melting points at 961° C. and 1064° C., respectively. Au is more costly compared to Ag. Ag and Au can be sputter deposited or plated. Ag can also be sintered Ag.

As shown in FIG. 16E, a plurality of the gap G1 among the diamond blocks 110 of the temporary composite wafer 200' are filled with spacer material 120'. The spacer material 120' may be formed of a material including, for example, filler, molding compound, etc. The filler can be diamond, silicon dioxide ($SiO_2$), silicon nitride ($Si_3N_4$), spin-on-glass (SOG), poly-silicon, etc., and the filler can be formed using deposition, spin coating etc. The molding compound can include a material such as a Novolac-based resin, an epoxy-based resin, a silicone-based resin, or another suitable encapsulant with suitable fillers such as powdered $SiO_2$. The molding compound may be overmolded on the diamond blocks 110 by using, for example, transfer molding, compression molding, etc.

As shown in FIG. 16F, a portion of the spacer material 120' is removed to form a plurality of the spacer 120 by using, for example, chemical mechanical polishing (CMP), deep reactive ion etching (DRIE), etc. Furthermore, the spacer material 120' can be planarized to expose the diamond blocks 110 to form the diamond composite wafer 200. After planarization, the spacers 120 each having the upper surface 120u and the diamond blocks 110 each having the upper surface 110u are formed, and the upper surfaces 110u and the upper surfaces 120u flush with each other. Each of the spacers 120 fills the gap G1 between two adjacent diamond blocks 110. So far, the diamond composite wafer 200 of FIG. 2 is formed or completed.

In another embodiment, the first semiconductor substrate 230 of the diamond composite wafer 200 of FIG. 16F may be removed to form the diamond composite wafer 100 of FIG. 1B.

In other embodiment, the second semiconductor substrate 330 of FIG. 3 may be attached to the diamond blocks 110 of FIG. 16F to form the diamond composite wafer 300 of FIG. 3.

In other embodiment, the first semiconductor substrate 230 of the diamond composite wafer 300 of FIG. 3 may be removed to form the diamond composite wafer 400 of FIG. 4.

FIGS. 17A to 17D are schematic diagrams of manufacturing processes of the diamond composite wafer 500 of FIG. 5 according to an embodiment of the present disclosure.

Figures 17A, 17B:
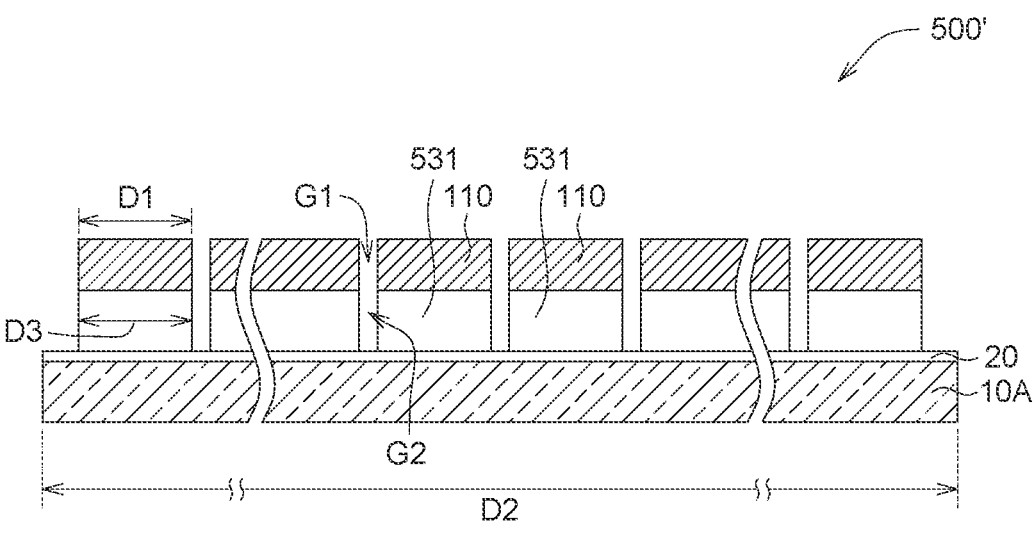

As shown in FIG. 17A, a plurality of the diamond blocks 110 and a plurality of the semiconductor blocks 531 are attached to a temporary carrier 10A with the predetermined diameter D2 to form a temporary composite wafer 500'. The diamond block 110 has the dimension D1 and the semiconductor block 531 has the dimension D3, wherein the dimension D1 and the dimension D3 are smaller than the predetermined diameter D2. In addition, a thermal conductivity of the semiconductor block 531 is smaller than that of the diamond block 110.

Two adjacent diamond blocks 110 are spaced by the gap G1, and two adjacent semiconductor blocks 531 are spaced by the gap G2. In an embodiment, the gap G1 may be equal to, greater than or smaller than the gap G2.

In an embodiment, before the diamond blocks 110 and the semiconductor blocks 531 are bonded to the temporary carrier 10A, the surfaces of the diamond blocks 110 and the surfaces of the semiconductor blocks 531 may be pre-treated and activated. The treated surfaces of the diamond blocks 110 are bonded to the treated surface of the semiconductor blocks 531 with the glue layer 240 (not shown in FIG. 17) or without the glue layer 240. In addition, the release layer 20 may be removed along with the temporary carrier 10A. When coating on the backside of an active IC wafer is involved, a diffusion barrier layer, for example, can be deposited on the wafer backside first. This barrier layer can be Ti, chromium (Cr) or tungsten (W).

As shown in FIG. 17B, the gaps G1 among the diamond blocks 110 and the gaps G2 among the semiconductor blocks 531 are filled with the spacer material 520'.

The spacer material 520' may be formed of a material including, for example, filler, molding compound, etc. The filler candidate can include diamond, silicon dioxide ($SiO_2$), silicon nitride ($Si_3N_4$), spin-on-glass (SOG), poly-silicon, etc., and the filler is formed using deposition, spin coating, etc. The molding compound includes a material such as a Novolac-based resin, an epoxy-based resin, a silicone-based resin, or another suitable encapsulant, and suitable fillers such as powdered $SiO_2$. The molding compound may be overmolded on the diamond blocks 110 by using, for example, transfer molding, compression molding, etc.

Figure 17C:
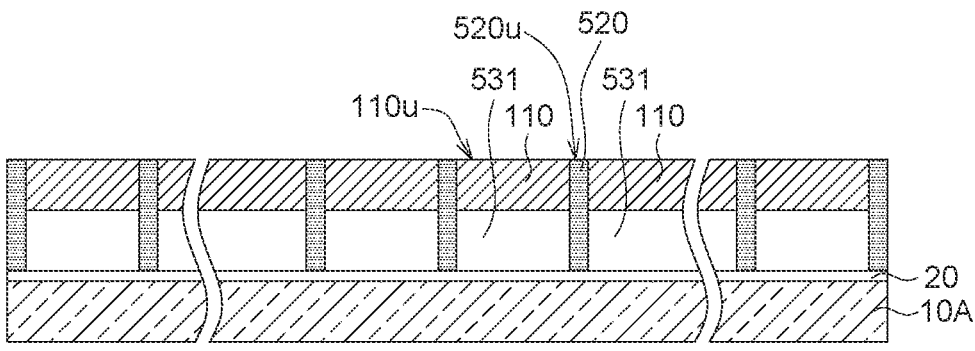

As shown in FIG. 17C, a portion of the spacer material 520' is removed to form a plurality of the spacer 520 by using, for example, CMP, DRIE, etc. Each of the spacers 520 fills the gap G1 between two adjacent diamond blocks 110 and the gap G2 between two adjacent semiconductor blocks 531. Furthermore, the spacer material 520' is planarized to expose the diamond blocks 110. After planarization, the spacers 520 each having the upper surface 520u and the diamond blocks 110 each having the upper surface 110u are formed, and the upper surface 110u and the upper surface 520u flush with each other.

Figure 17D:
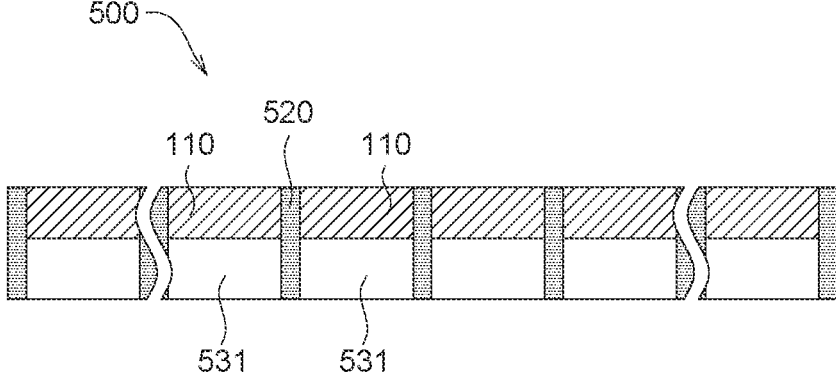

As shown in FIG. 17D, the temporary carrier 10A and the release layer 20 are removed to expose the semiconductor blocks 531 and to form the diamond composite wafer 500.

In another embodiment, the diamond composite wafer 500 of FIG. 17D and the second semiconductor substrate 330 are connected to each other to form the diamond composite wafer 600 of FIG. 6.

In another embodiment, the diamond composite wafer 500 of FIG. 17D and the first semiconductor substrate 230 are connected to each other.

In another embodiment, the semiconductor blocks 531 and a portion of each spacer 520 are removed from the diamond composite wafer 600 of FIG. 6 to form the diamond composite wafer 700 of FIG. 7.

In another embodiment, the semiconductor blocks 531 and a portion of each spacer 520 of FIG. 17D are removed to form the diamond composite wafer 100 of FIG. 1B.

In another embodiment, the semiconductor blocks 531 and the diamond blocks 110 of FIG. 17A may be replaced by a plurality of the composite blocks 800A of FIG. 8. Furthermore, the composite block 800A may be formed by depositing the diamond layer 810 and then a sacrificial layer on the semiconductor blocks 531, then planarizing and etching the sacrificial layer to form the composite block 800A, wherein each composite block 800A includes the diamond layer 810 on the semiconductor block 531. Then, the composite blocks 800A are attached on the temporary carrier 10A by the release layer 20. The other process steps of the diamond composite wafer 800 of FIG. 8 are the same as or similar to the corresponding process steps of the diamond composite wafer 500, and the similarities will not be repeated here.

FIGS. 18A to 18H are schematic diagrams of manufacturing processes of the diamond composite wafer 500 of FIG. 5 according to another embodiment of the present disclosure.

Figure 18A:
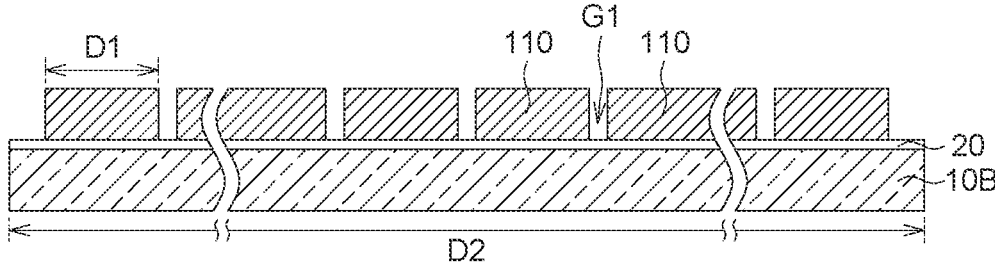

As shown in FIG. 18A, the diamond blocks 110 are attached on a temporary carrier 10B with the predetermined diameter D2 by the release layer 20. Two adjacent diamond blocks 110 are spaced by the gap G1.

Figure 18B:
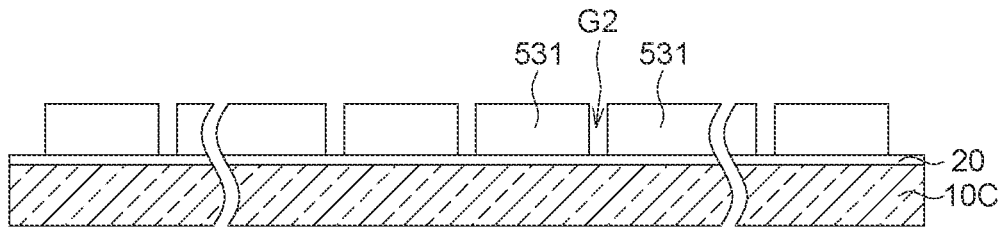

As shown in FIG. 18B, the semiconductor blocks 531 are attached on a temporary carrier 10C with the predetermined diameter D2 by the release layer 20. Two adjacent semiconductor block 531 are spaced by the gap G2.

Figure 18C:
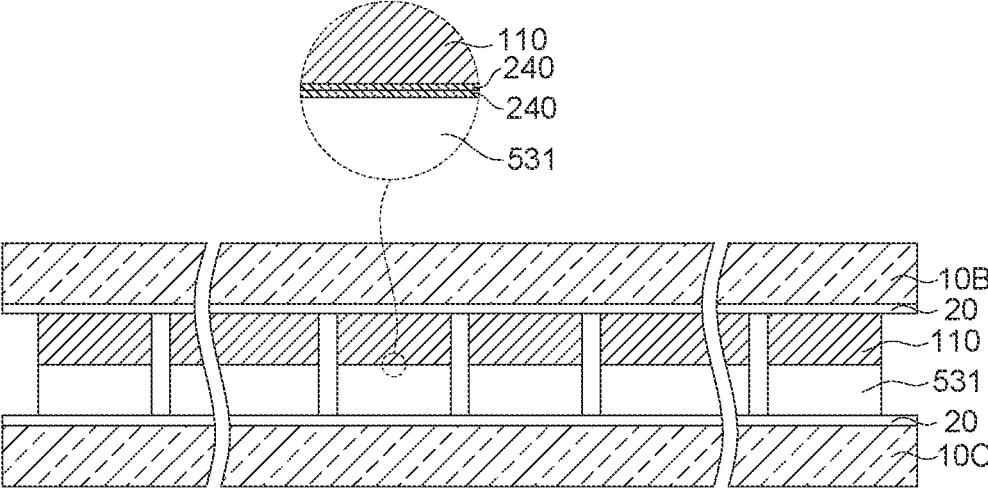

As shown in FIG. 18C, the diamond blocks 110 which are attached to the temporary carrier 10B are bonded to the semiconductor blocks 531 which are attached to the temporary carrier 10C with or without the glue layer 240.

In an embodiment, before the diamond blocks 110 are bonded to the semiconductor blocks 531, the surfaces of the diamond blocks 110 and the surfaces of the semiconductor blocks 531 may be pre-treated and activated. The treated surfaces of the diamond blocks 110 are bonded to the treated surface of the semiconductor blocks 531 with the glue layer 240 or without the glue 240. In addition, the release layer 20 may be removed with the temporary carrier 10A. When coating on the backside of an active IC wafer is involved, a diffusion barrier layer, for example, can be deposited on the wafer backside first. This barrier layer can be Ti, chromium (Cr) or tungsten (W).

Figure 18D:
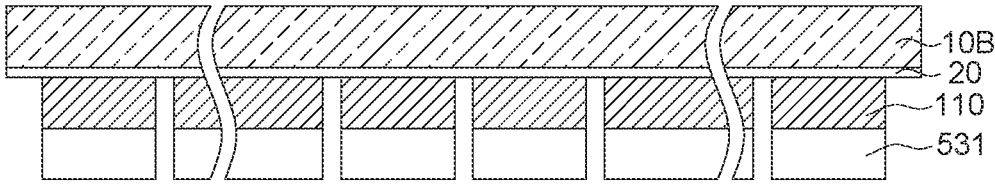

As shown in FIG. 18D, the temporary carrier 10C is released to reveal the semiconductor blocks 531.

Figure 18E:
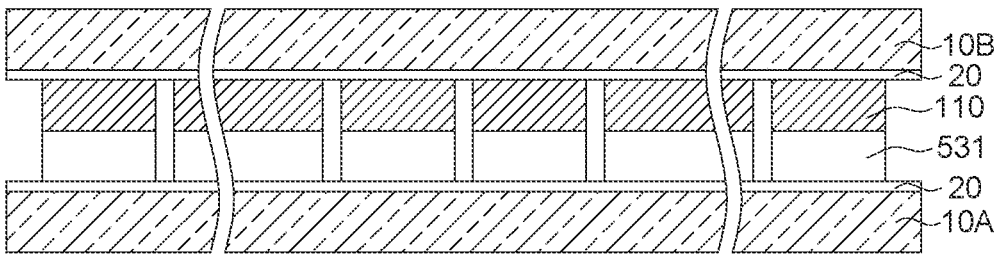

As shown in FIG. 18E, the temporary carrier 10A is attached to the revealed semiconductor blocks 531 by the release layer 20.

Figure 18F:
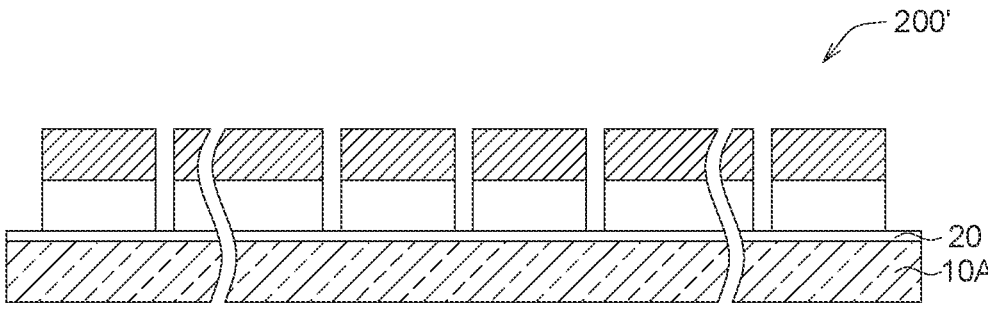

As shown in FIG. 18F, the temporary carrier 10B is released to form the temporary composite wafer 200'.

Figure 18G:
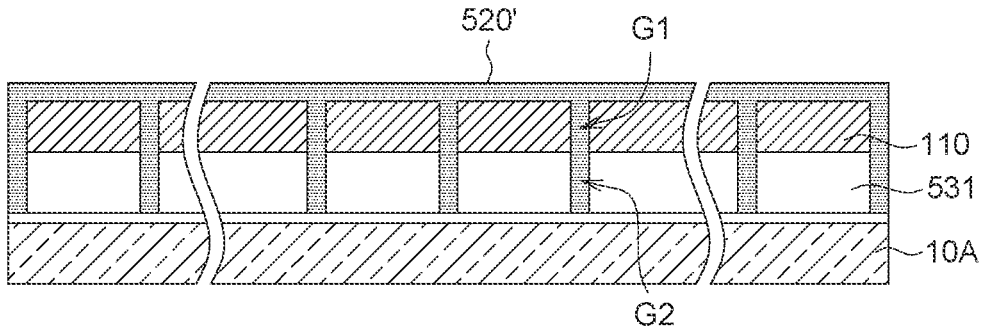

As shown in FIG. 18G, the gaps G1 among the diamond blocks 110 and the gaps G2 among the semiconductor blocks 531 are filled with the spacer material 520'. The spacer material 520' may be formed of a material including, for example, filler, molding compound, etc. The filler can be formed using deposition, spin coating, etc. The molding compound may be overmolded on the diamond blocks 110 by using, for example, transfer molding, compression molding, etc.

Figure 18H:
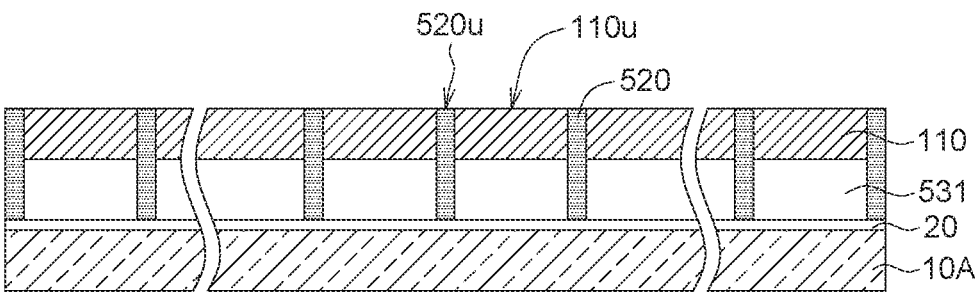

As shown in FIG. 18H, a portion of the spacer material 520' is removed to form the spacers 520 by using, for example, CMP, DRIE, etc. Furthermore, the spacer material 520' is planarized to expose the diamond blocks 110. After planarization, the spacers 520 each having the upper surface 520u and the diamond blocks 110 each having the upper surface 110u are formed, and the upper surface 110u and the upper surface 520u flush with each other.

Then, the temporary carrier 10A and the release layer 20 of FIG. 18H are removed to form the diamond composite wafer 500 of FIG. 5.

FIGS. 19A to 19E are schematic diagrams of manufacturing processes of the diamond composite wafer 900 of FIG. 9 according to an embodiment of the present disclosure.

As shown in FIG. 19A, the diamond block 110 is attached to the semiconductor block 831, wherein each semiconductor block 831 is a SOI block with the Si layer 8311, the $SiO_2$ layer 8312 and the bulk Si 8313, and the $SiO_2$ layer 8312 is formed between the Si layer 8311 and the Si bulk 8313.

The surfaces of the diamond blocks 110 and the surfaces of the semiconductor blocks 831 may be pre-treated and activated. The treated surfaces of the diamond blocks 110 are bonded to the treated surface of the semiconductor blocks 831 with the glue layer 240 or without the glue layer 240. In addition, the glue layer 240 may be removed with the temporary carrier 10B and the release layer 20 of FIG. 19C.

As shown in FIG. 19B, the Si bulk 8313 is removed by using, for example, back-grinding, CMP, a KOH etch, etc., and the $SiO_2$ layer 8312 is removed by using, for example, HF etch, etc. After the Si bulk 8313 and the $SiO_2$ layer 8312 are removed, the Si layer 8311 is exposed and the diamond block 110 and the Si layer 8311 form one composite block 900A.

The silicon oxide layer may be etched off with a HF etching step. For silicon, common chemical etchants are mixtures of nitric acid ($HNO_3$) and hydrofluoric acid (HF). One of the most common etchant used to remove $SiO_2$ is dilute solutions of HF. SOI enables lower overall processor operating powers. Compared to bulk silicon, ICs built by SOI wafers show a performance gain of 30% at identical feature sizes due to the electrical isolation provided by $SiO_2$. Replacing $SiO_2$ with diamond with a thermal conductivity (TC) that is over 2000 times that of $SiO_2$ may dramatically improves processor performance and enables powers and 3× circuit densities compared to SOIs based on $SiO_2$.

Bonding of SCD to SiC may be achieved at room (or low temperatures) by protecting the diamond surface with an ultrathin metal layer such as Ti of 10 nm or less during FAB (using, e.g., Ar neutral atom) irradiation (i.e., surface activation) prior to SiC-to-diamond bonding. There are many applications that may take advantage of SiC-diamond bonding for enhanced heat dissipation, two of which are high-power GaN HEMT to boost radar performance and cooling of SiC devices for high-power, high-temperature and high-reliability applications such as SiC inverters for electrical vehicles. GaN is a material that may be used in the production of semiconductor power devices, LEDs and RF components. GaN may be integrated with diamond to boost its performance using the processes and structures disclosed above. GaN on diamond makes the material particularly attractive for high power RF applications such as radar applications. GaN based HEMTs are suitable for microwave and millimeter-wave amplifiers with high output power and high-efficiency in long distance radio wave applications. During their operation in high speed switching applications, the local flux value could reach more than ten times larger than that of the sun surface. Proper heat spreading by placing diamond as close as possible to the hot spots (and better yet to immediate vicinity of chip hot spots) may decrease the channel temperature effectively, facilitating device stability and use life. SiC is currently used as the substrate in some GaN HEMT power amp applications to facilitate heat dissipation. Even though the TC of SiC is already high, diamond with a far higher TC than SiC (about 4-5×) may be bonded to SiC and the two combined also allow increasing power output and hence GaN HEMT increased performance.

Figure 19C:
Figure 19C:
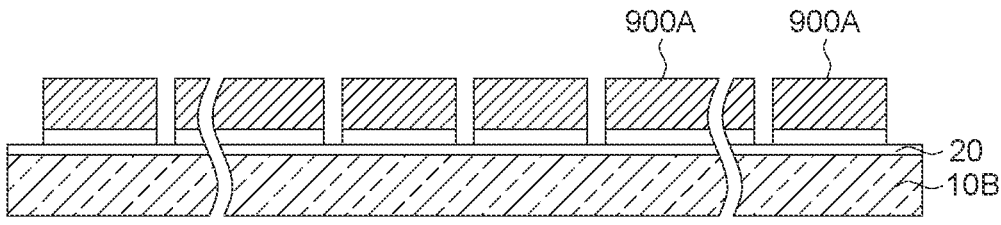

As shown in FIG. 19C, a plurality of the composite blocks 900A of FIG. 19B are attached on the temporary carrier 10B using the release layer 20.

Figure 19D:
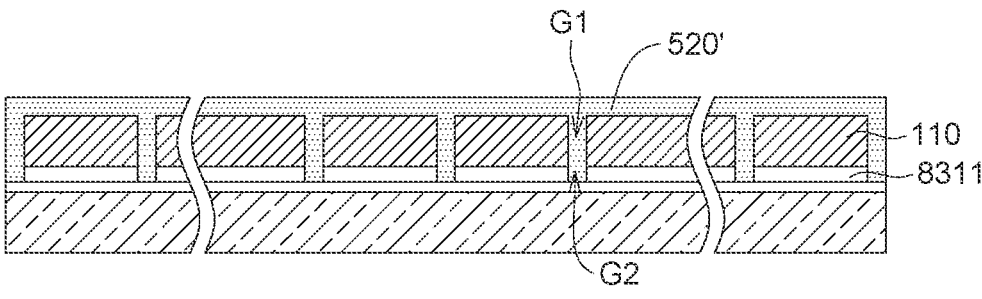

As shown in FIG. 19D, the gaps G1 among the diamond blocks 110 and the gaps G2 among the Si layers 8311 are filled with the spacer material 520'. The spacer material 520' may be formed of a material including, for example, filler, molding compound, etc. The filler is formed using deposition, spin coating, etc. The molding compound may be overmolded on the diamond blocks 110 by using, for example, transfer molding, compression molding, etc.

Figure 19E:
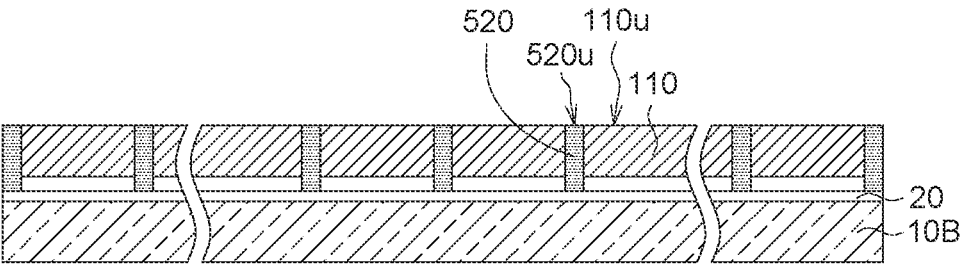

As shown in FIG. 19E, a portion of the spacer material 520' is removed to form a plurality of the spacer 520 by using, for example, CMP, DRIE, etc. Each the spacer 520 fills the gap G1 between two adjacent diamond blocks 110 and the gap G2 between two adjacent Si layers 8311. Furthermore, the spacer material 520' is planarized to expose the diamond blocks 110. After planarization, the spacers 520 each having the upper surface 520u and the diamond blocks 110 each having the upper surface 110u are formed, and the upper surface 110u and the upper surface 520u flush with each other.

Then, the temporary carrier 10B and the release layer 20 of FIG. 19E are removed to form the diamond composite wafer 900 of FIG. 9.

In an embodiment, the temporary carrier 10B and the release layer 20 of FIG. 19E are removed, and the second semiconductor substrate 330 are attached on the diamond blocks 110 to form the diamond composite wafer 1000 of FIG. 10.

In another embodiment, the temporary carrier 10B and the release layer of FIG. 19E are removed, and the Si layers 8311 and a portion of the spacer 820 are removed to form the diamond composite wafer 100 of FIG. 1B.

FIGS. 20A to 20J are schematic diagrams of manufacturing processes of the diamond composite wafer 900 of FIG. 9 according to another embodiment of the present disclosure.

Figure 20A:
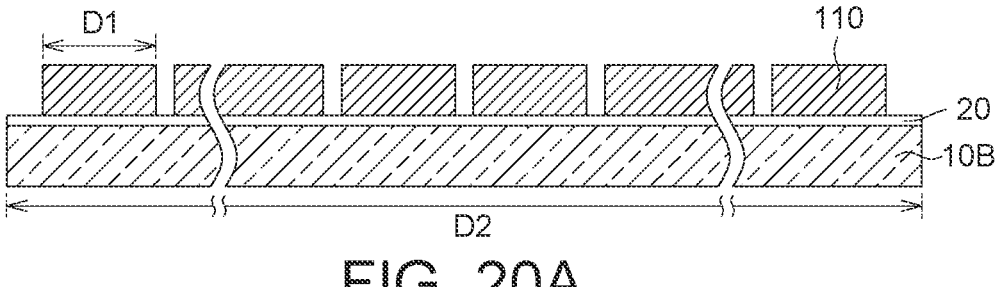

As shown in FIG. 20A, the diamond blocks 110 are attached on the temporary carrier 10B with the predetermined diameter D2. Each diamond block 110 has the dimension D1 smaller than the predetermined diameter D2 of the temporary carrier 10B.

Figure 20B:
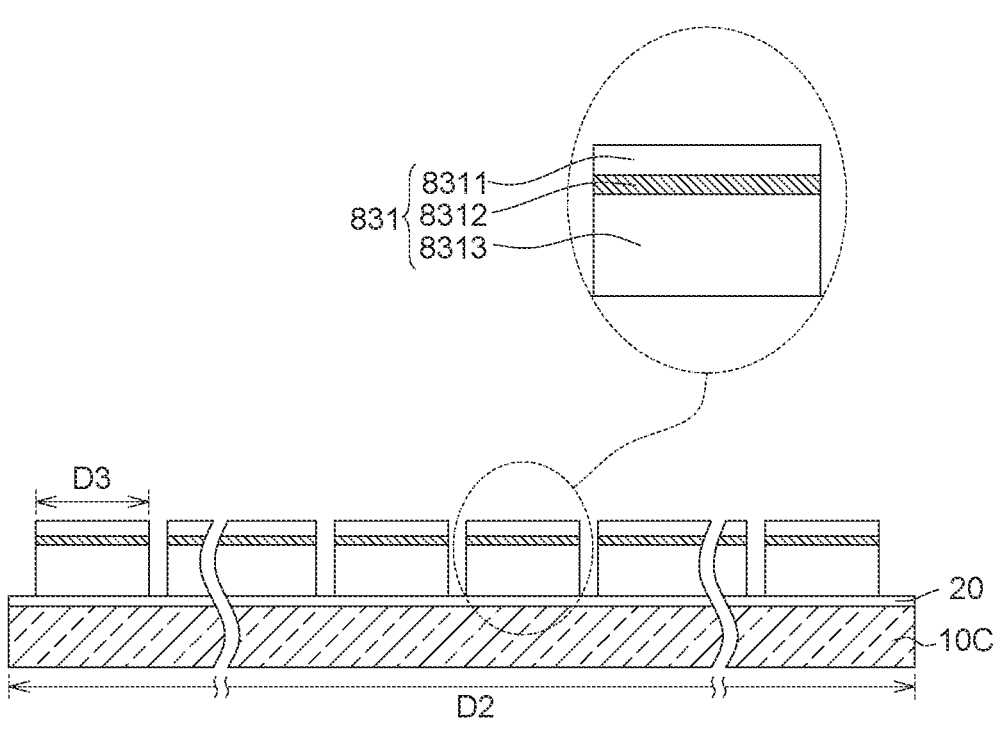

As shown in FIG. 20B, the semiconductor blocks 831 are attached on the temporary carrier 10C with the predetermined diameter D2, wherein each semiconductor block 831 is the SOI block with the Si layer 8311, the SiO₂ layer 8312 and the bulk Si 8313, and the SiO₂ layer 8312 is formed between the Si layer 8311 and the bulk Si 8313. Each semiconductor block 831 has the dimension D3 equal to, smaller than or greater than the dimension D1 of the diamond block 110 of FIG. 20A.

Figure 20C:
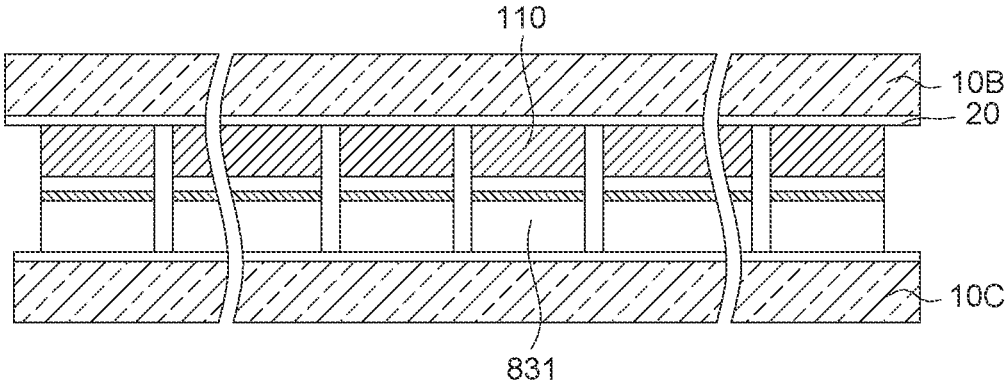

As shown in FIG. 20C, the diamond blocks 110 which are attached to the temporary carrier 10B are attached to the semiconductor blocks 831 which are attached to the temporary carrier 10C.

Before the diamond blocks 110 are bonded to the semiconductor blocks 831, the surfaces of the diamond blocks 110 and the surfaces of the semiconductor blocks 831 may be pre-treated and activated. The treated surfaces of the diamond blocks 110 are bonded to the treated surface of the semiconductor blocks 831 with the glue layer 240 or without the glue layer 240. In addition, the release layer 20 may be removed with the temporary carrier 10B and/or the temporary carrier 10C.

Figure 20D:
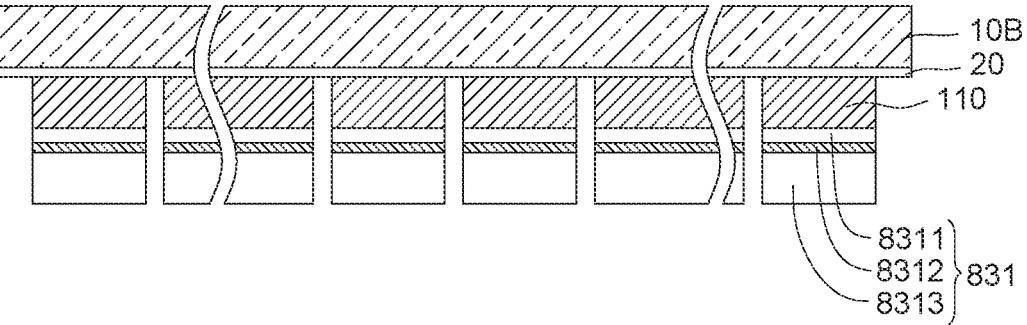

As shown in FIG. 20D, the temporary carrier 10C is removed to reveal the semiconductor block 831.

Figure 20E:
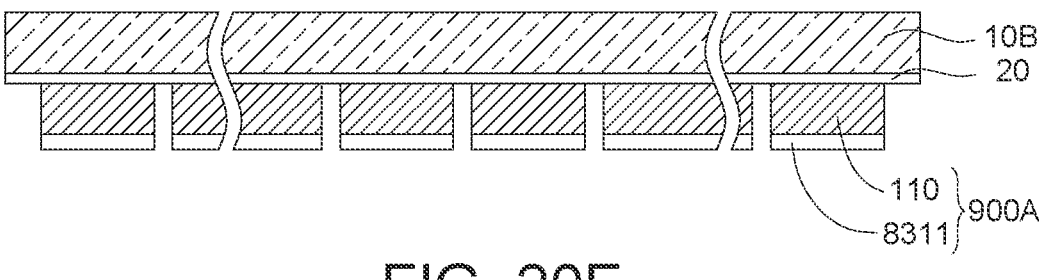

As shown in FIG. 20E, the bulk Si 8313 is removed by using, for example, back-grinding, CMP, a KOH etch, etc., and the SiO₂ layer 8312 is removed by using, for example, HF etch, etc. After the bulk Si 8313 and the SiO₂ layer 8312 are removed, the Si layer 8311 is exposed and the diamond block 110 and the Si layer 8311 form one composite block 900A.

Figure 20F:
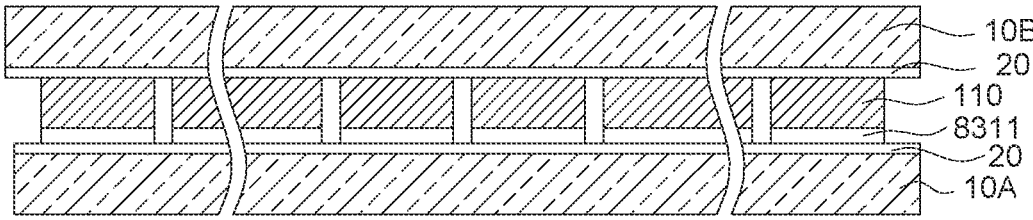

As shown in FIG. 20F, the temporary carrier 10A is attached to the revealed Si layers 8311 with the release layer 20.

Figure 20G:
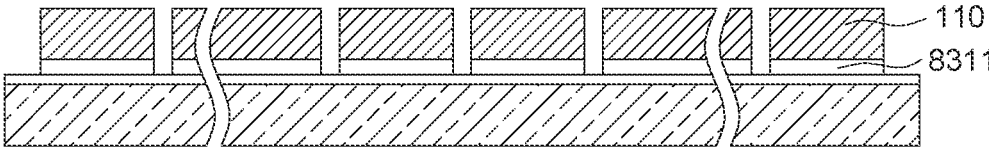

As shown in FIG. 20G, the temporary carrier 10B and the release layer 20 of FIG. 20F are removed to expose the diamond blocks 110.

Figure 20H:
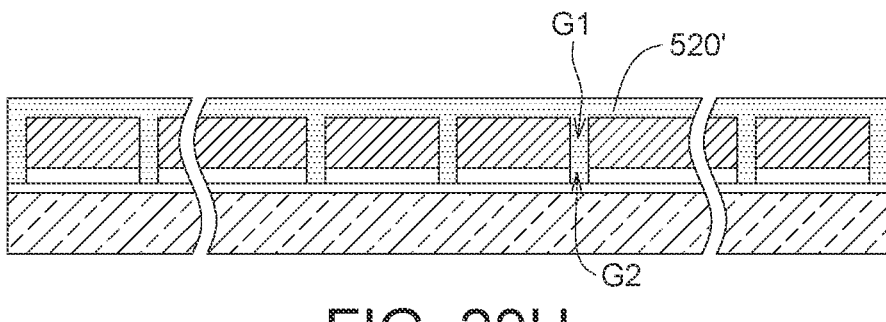

As shown in FIG. 20H, the gaps G1 among the diamond blocks 110 and the gaps G2 among the semiconductor blocks 531 are filled with the spacer material 520'. The spacer material 520' may be formed of a material including, for example, filler, molding compound, etc. The filler is formed through deposition, coating, molding etc. of a material such as a molding compound, a spin-on glass (SOG), diamond, SiO₂, polysilicon, etc. The molding compound may be overmolded on the diamond blocks 110 by using, for example, transfer molding, compression molding, etc.

Figure 20I:
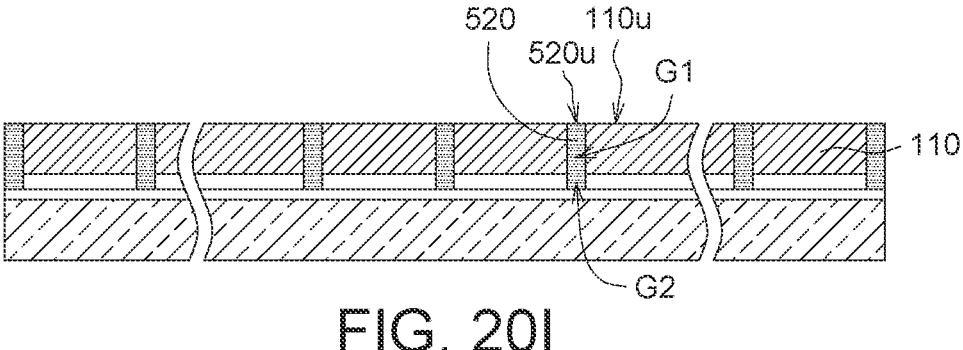

As shown in FIG. 20I, a portion of the spacer material 520' is removed to form a plurality of the spacers 520 by using, for example, CMP, DRIE, etc. Each the spacer 520 fills the gap G1 between two adjacent diamond blocks 110 and the gap G2 between two adjacent Si layers 8311. Furthermore, the spacer material 520' is planarized to expose the diamond blocks 110. After planarization, the spacers 520 each having the upper surface 520u and the diamond blocks 110 each having the upper surface 110u are formed, and the upper surface 110u and the upper surface 520u flush with each other.

Figure 20J:
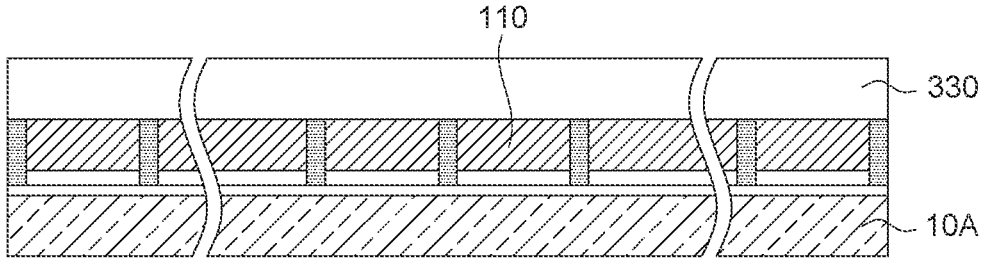

As shown in FIG. 20J, the second semiconductor substrate 330 is attached to the diamond blocks 110. In another embodiment, the first semiconductor substrate 230 may be attached to the diamond blocks 110.

Then, the temporary carrier 10A and the release layer 20 of FIG. 20J are removed to expose the Si layers 8311 and form the diamond composite wafer 1000 of FIG. 10.

In an embodiment, the temporary carrier 10A and the release layer 20 of FIG. 20I are removed to form the diamond composite wafer 900 of FIG. 9.

As described above, a filler material such as diamond or SiO₂ is deposited by CVD. Molding compound is overmolded on diamond plates by transfer or compression molding machines. When diamond is used as the filler, it may be planarized following filler deposition to form 12" silicon-diamond bi-wafer with the use of a combination of sacrificial layer such as CVD SiO₂ (after diamond deposition and some preliminary CMP) deposition, CMP and DRIE. In the case of molding compound, it may be planarized by backgrinding, as is typical of fan-out processing. Polysilicon may be deposited using catalytic CVD at a temperature as low as 180° C. SiO₂, on the other hand, may be deposited at 250° C. by plasma enhanced CVD. SOG which mixes SiO₂ and either boron or phosphorous with the mixture suspended in a solvent solution. It is easy to apply by spin coating it onto a particle-free substrate. SOG may achieve good thickness uniformity. Siloxane type SOG may be deposited by multiple spin, bake and cure processes.

FIGS. 21A to 21C are schematic diagrams of manufacturing processes of the diamond composite IC wafer 1200 of FIG. 12 according to an embodiment of the present disclosure.

As shown in FIG. 21A, the first semiconductor wafer 1102 with the predetermined diameter D2 are prepared, wherein the first semiconductor wafer 1102 includes a set of IC circuits on a first side of the first semiconductor wafer 1102.

As shown in FIG. 21B, the diamond composite wafer 1101 with the predetermined diameter D2 is prepared.

As shown in FIG. 21C, the diamond composite wafer 1101 is bonded to the first semiconductor wafer 1102 to form the diamond composite IC wafer 1200'.

Then, at least one first semiconductor wafers 1102 is attached to the first semiconductor wafer 1102 of the diamond composite IC wafer 1200' of FIG. 21C to form the diamond composite IC wafer 1200 of FIG. 12, wherein a plurality of the first semiconductor wafers 1102 are connected to each other by micro-bump or hybrid bond.

In another embodiment, at least one diamond containing interposer 1203 and at least one first semiconductor wafers 1102 of FIG. 13 may be bonded to the diamond composite IC wafer 1200' of FIG. 21C to form the diamond composite IC wafer 1300 of FIG. 13.

The diamond composite IC wafer is bonded to the semiconductor wafer through, for example, micro-bump, or copper hybrid bonding based on oxide-to-oxide bonding or polyimide (PI)-to-PI bonding. Furthermore, when copper hybrid bonding instead of the traditional micro-bumps is used for interconnection, the packages may be leak-proof in the case of immersion cooling (when a dielectric coolant is used) using oxide-to-oxide based copper hybrid bonding. For copper hybrid bonding, one may choose oxide-to-oxide bonding or polyimide (PI)-to-PI bonding for bonding two IC wafers using silicon dioxide ($SiO_2$) or PI as the BEOL dielectric/bonding layers.

Direct oxide-to-oxide bonding proceeds generally in the following process sequence: (1) formation of dangling bonds and bonding between hydroxyl groups and water molecules through plasma activation using gases such as O2 (oxygen)/N2 (nitrogen)/Ar (argon); (2) removal of defects through deionized water cleaning and scrubbing; (3) bonding of wafers (or wafer and wafer-sized interposer) with oxide bonding layers at room temperature and atmospheric pressure via van der Waals hydrogen bonds between two to three monolayers of water molecules and polar hydroxyl (OH) groups (which terminate at both the native and thermal $SiO_2$); (4) formation of van der Waals bonds between H2O molecules and silanol groups (Si—OH—(H2O)x-HO—Si; silanol group=Si—OH) on the top and bottom wafer surfaces; and (5) annealing to remove water molecules at the interface and form covalent bonds at temperatures typically less than 400° C. Void formation caused by water droplet formation (the Joule-Thomason expansion effect) at wafer edge during direct bonding must be avoided by controlling key parameters such as plasma conditions, surface roughness, degree of cleanliness, wafer warpage/flatness and bonding conditions. In the case of oxide-to-oxide bonding, one may also vary oxide type and deposition technique, process conditions such as plasma gas, plasma power, surface roughness pertaining to chemical mechanical polish (CMP), surface cleanliness, mono- to multiple layers of water molecules from de-ionized cleaning, bonding conditions (such as temperature and speed), and anneal conditions (e.g., anneal temperatures, anneal time and number of annealing steps) to maximize the bonding yield and shear strength between two wafers.

Regarding PI-to-PI bonding using fully cured polyimide-to-fully cured polyimide bonding based on pyromellitic dianhydride (PMDA) and 4,4'-diaminodiphenyl ether (4,4'-

ODA) as an example, one may maximize the shear strength by varying conditions such as volume of water introduced, bonding time, and oxygen (O2) plasma activation time. To achieve void-free PI-to-PI bonding, it is important to activate the PI surfaces by oxygen plasma activation to generate low-density hydrophilic groups on the PI surface which effectively enhances adsorption of water molecules introduced by a de-ionized water wetting process. The adsorbed water molecules, in turn, brings in considerable high-density OH (hydroxyl) groups which facilitate pre-bonding Following PI surface activation and wetting, PI-to-PI hybrid bonding may take place at a relative low temperature of 250° C. for a few minutes only when a permanent bond is desired. Neither the plasma process nor the wetting or hydration process alone may achieve good bonding. Key parameters to manipulate in order to achieve good bond yield include plasma activation time, volume of water introduced, bonding temperature and bonding time.

Oxide-to-oxide hybrid bonding requires high component flatness and surface cleanliness to avoid electrical interconnection fails due to silicon dioxide's high hardness and poor deformation characteristics. Compared to the conventional oxide-to-oxide hybrid bonding, PI-to-PI bonding allows for higher surface roughness and is more tolerant of component flatness due to the low modulus and more compliant characteristics of the PIs.

The explosion in data is driving extraordinary growth in internet traffic and cloud services. Silicon photonics will take the center stage in defining new mega data center architectures in order to manage the unabated growth in data traffic. New microelectronics packaging technologies are required to address optical-to-electrical interconnection as photon and electron exchanges move from optical transceivers mounted at the edge of server boards (in server racks inside mega data centers) to IC packages and logic chips inside these computing systems. Optics has traditionally been deployed to transmit data over long distances because light may carry considerably more information content (bits) at faster speed and light is more energy efficient compared to electronic alternatives to transmit data when the transmission length and bandwidth increases. Optical transceivers represent the initial high volume application for silicon photonics starting from 100G as optics migrates as close as possible to the source of the data, resulting in large distances between the optical components and the processor chip. Using the silicon interposer based optical module as an example, its performance may be greatly enhanced by replacing the silicon interposer with a silicon-diamond bi-wafer interposer containing backside power supply and both optical waveguides and active and passive functions in silicon. Using a combination of photolithography, reactive ion etching (RIE) and focused ion beam techniques, one may also fabricate in the diamond portion of the bi-wafer an optical chip that integrates function elements such as X-crossings, Y-functions, evanescent couplers, Bragg reflectors/couplers and various interferometers. As the need for higher data transfer speeds at greater baud rates and lower power levels intensifies, the trend is for optics to be moved even closer to the die. To this end, optoelectronic interconnect will need to be designed to interface directly to the processor, whether it be application specific integrated circuit (ASIC) or FPGA, to support switching, transceiver, signal conditioning and multiplexer/demultiplexer applications. This requires co-packaging of the optical module based on a silicon interposer with processor such as silicon based ASIC/FPGA/CPU (or its chiplets) flip chip bonded to a laminate substrate. As in the case of silicon-diamond bi-wafer enhanced optical module, the performance of this more complex SiP may be greatly enhanced by mounting the bi-wafer enabled optical module and the bi-wafer enabled ASIC/FPGA/CPU (with a diamond heat spreader attached) on a diamond or silicon-diamond interposer as shown by a bottom structure.

FIGS. 22A to 22C are schematic diagrams of manufacturing processes of the diamond composite IC wafer 1200 of FIG. 12 according to another embodiment of the present disclosure.

As shown in FIG. 22A, the first semiconductor wafer 1102 with the predetermined diameter D2 are prepared, wherein the first semiconductor wafer 1102 includes a set of IC circuits on a first side of the first semiconductor wafer 1102. Then, a plurality of the diamond blocks 110 each having the dimension D1 are prepared, and then are attached on the first semiconductor wafer 1102.

Before bonding, it is preferable that diamond is deposited with a surface layer that forms chemical bonds with diamond such as Ti and a bonding layer such as Au or a solder (or a transient liquid phase material), and the backside of silicon deposited with a good diffusion barrier layer such as Ti, TiN, Ti/TiN or Ti/Ni and a bonding layer such as Au or a solder to enable low-temperature bonding at temperatures preferably below 300° C. In addition, the diffusion barrier layer may be formed on a second side of the first semiconductor wafer 1102.

As shown in FIG. 22B, a plurality of the gap G1 among the diamond blocks 110 are filled with spacer material 120'.

The spacer material 120' may be formed of a material including, for example, filler, molding compound, etc. The filler can be diamond, silicon dioxide ($SiO_2$), silicon nitride ($Si_3N_4$), spin-on-glass (SOG), polysilicon, etc., and the filler is formed using deposition, spin coating, molding, etc. The molding compound includes a material, for example, a Novolac-based resin, an epoxy-based resin, a silicone-based resin, or another suitable encapsulant, and suitable fillers such as powdered $SiO_2$. The molding compound may be overmolded on the diamond blocks 110 by using, for example, transfer molding, compression molding, etc.

As shown in FIG. 22C, a portion of the spacer material 120' is removed to form a plurality of the spacer 120 by using, for example, CMP, DRIE, etc. Each the spacer 120 fills the gap G1 between two adjacent diamond blocks 110. Furthermore, the spacer material 120' may be planarized to expose the diamond blocks 110 to form the diamond composite wafer 200. After planarization, the spacers 120 each having the upper surface 120*u* and the diamond blocks 110 each having the upper surface 110*u* are formed, and the upper surfaces 110*u* and the upper surfaces 120*u* flush with each other. After planarization, the first semiconductor wafer 1102, the spacers 120 and the diamond blocks 110 form the diamond composite IC wafer 1200' of FIG. 13.

Then, at least one first semiconductor wafers 1102 is attached to the first semiconductor wafer 1102 of the diamond composite IC wafer 1200' to form the diamond composite IC wafer 1200 of FIG. 12, wherein a plurality of the first semiconductor wafers 1102 are connected to each other by micro-bump or hybrid bond.

In another embodiment, at least one diamond containing interposer 1203 and at least one first semiconductor wafers 1102 of FIG. 13 may be bonded to the diamond composite IC wafer 1200' of FIG. 21C to form the diamond composite IC wafer 1300 of FIG. 13.

FIGS. 23A to 23C are schematic diagrams of manufacturing processes of the diamond composite IC wafer 1300 of FIG. 13 according to another embodiment of the present disclosure.

As shown in FIG. 23A, the first semiconductor wafer 1102 with the predetermined diameter D2 are prepared, wherein the first semiconductor wafer 1102 includes a set of IC circuits on a first side of the first semiconductor wafer 1102.

As shown in FIG. 23B, the diamond wafer 1301 with the predetermined diameter D2 is prepared.

As shown in FIG. 23C, the diamond wafer 1301 is bonded to the first semiconductor wafer 1102 to form the diamond composite IC wafer 1400'.

Then, at least one first semiconductor wafers 1102 is attached to the first semiconductor wafer 1102 of the diamond composite IC wafer 1400' of FIG. 23C to form the diamond composite IC wafer 1400 of FIG. 14.

In another embodiment, at least one first semiconductor wafers 1102 and at least one diamond containing interposer 1203 of FIG. 15 may be bonded to the diamond composite IC wafer 1400' of FIG. 23C to form the diamond composite IC wafer 1500 of FIG. 15, wherein a plurality of the first semiconductor wafers 1102 are connected to each other by micro-bump or hybrid bond.

To sum up, a manufacturing method of a diamond composite wafer is provided. In an embodiment, diamond composite wafer at least includes at least one diamond block formed of diamond material. Accordingly, the diamond composite wafer has good theoretical semiconductor performance characteristics and good cooling performance.

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A method to form a first diamond composite wafer, a second diamond composite wafer or a third diamond composite wafer with a first predetermined diameter, comprising:
   (a) preparing a plurality of diamond blocks, wherein a dimension of each diamond block is smaller than the first predetermined diameter;
   (b) attaching the plurality of diamond blocks to a first semiconductor substrate with the first predetermined diameter to form a first temporary composite wafer, wherein a thermal conductivity of the first semiconductor substrate is smaller than that of the diamond block; and
   (c) filling gaps among the plurality of diamond blocks of the first temporary composite wafer to form the first diamond composite wafer; or attaching the first diamond composite wafer to a second semiconductor substrate with the first predetermined diameter to form the second diamond composite wafer, or removing the first semiconductor substrate from the first diamond composite wafer to form the third diamond composite wafer.

2. The method in claim 1, wherein the step (b) comprises:
   (b1) attaching the plurality of diamond blocks on a temporary carrier with the first predetermined diameter by a release layer; and
   (b2) bonding the plurality of diamond blocks which is attached to the temporary carrier to the first semiconductor substrate, and releasing the temporary carrier from the plurality of diamond blocks to form the first temporary composite wafer.

3. The method in claim 2, wherein the step of bonding the plurality of diamond blocks which is attached to the temporary carrier to the first semiconductor substrate in step (b2) comprising:

(b21) treating the surfaces of the plurality of diamond blocks and the surface of the first semiconductor substrate; and (b22) bonding the treated surfaces of the plurality of diamond blocks to the treated surface of the first semiconductor substrate with or without a glue layer.

4. The method in claim 2, wherein the glue layer is selected from the group consisting of Si (e.g., poly-silicon), $SiO_2$, $Si_3N_4$, amorphous silicon nitride, $Al_2O_3$ (alumina), aluminum nitride, diamond, boron nitride and graphene; or selected from the group consisting of Ti, W, Pt, Cr, Au, Cu, Ir, nickel (Ni), nickel-vanadium (Ni—V), iron (Fe), Ag—In, Au—In, Ag, Sn, Mo and other transient liquid phase bonding metals; or selected from the group consisting of Ir on SrTiO3, Ir on YSZ/Si, Ir on MgO, sapphire, TaO3 and combinations thereof.

5. The method in claim 1, the step of filling gaps among the plurality of diamond blocks of the first temporary composite wafer to form the first diamond composite wafer in step (c) comprising:

(c1) depositing a filler to fill gaps among the plurality of diamond blocks of the first temporary composite wafer; and (c2) planarizing the filler to expose the plurality of diamond blocks to form the first diamond composite wafer.

6. The method in claim 1, wherein the filler is one selected from a group consisting of diamond, silicon dioxide ($SiO_2$), silicon nitride ($Si_3N_4$), spin-on-glass (SOG), and polysilicon.

7. The method in claim 1, the step of filling gaps among the plurality of diamond blocks of the first temporary composite wafer to form the first diamond composite wafer in step (c) comprising:

(c3) depositing a molding compound to fill gaps among the plurality of diamond blocks of the first temporary composite wafer; and (c4) planarizing the molding compound to expose the plurality of diamond blocks to form the first diamond composite wafer.

8. The method in claim 1, wherein the step of attaching the first diamond composite wafer to the second semiconductor substrate to form the third diamond composite wafer in step (c) comprises:

(c5) treating the surfaces of the plurality of diamond blocks and the surface of the second semiconductor substrate; and (c6) bonding the treated surfaces of the plurality of diamond blocks to the treated surface of the second semiconductor substrate with or without a glue layer to form the second diamond composite wafer.

9. The method in claim 1, wherein the first predetermined diameter is 12", and the first semiconductor substrate and the second semiconductor substrate are silicon or SOI.

10. The method in claim 1, wherein the first predetermined diameter is 8", and the first semiconductor substrate and the second semiconductor substrate are SiC or silicon substrates.

11. A method to form a first diamond composite wafer, a second diamond composite wafer, a third diamond composite wafer or a fourth diamond composite wafer with a first predetermined diameter, comprising:

(a) attaching a plurality of diamond blocks and a plurality of semiconductor blocks to a first temporary carrier with the first predetermined diameter to form a first temporary composite wafer, wherein both a dimension of each diamond block and a dimension of each semiconductor block are smaller than the first predetermined diameter, and a thermal conductivity of the semiconductor block is smaller than that of the diamond block; and (b) filling gaps among the plurality of diamond blocks and gaps among the plurality of semiconductor blocks, and removing the first temporary carrier to form the fourth diamond composite wafer; or attaching the fourth diamond composite wafer to a first semiconductor substrate with the first predetermined diameter to form the second diamond composite wafer; or removing the plurality of semiconductor blocks from the second diamond composite wafer to form the first diamond composite wafer; or removing the plurality of semiconductor blocks from the fourth diamond composite wafer to form the third diamond composite wafer.

12. The method in claim 11, wherein the step (a) comprises:

(a1) attaching the plurality of diamond blocks on a second temporary carrier with the first predetermined diameter;

(a2) attaching the plurality of semiconductor blocks on a third temporary carrier with the first predetermined diameter;

(a3) attaching the plurality of diamond blocks which is attached to the second temporary carrier to the plurality of semiconductor blocks which is attached to the third temporary carrier with or without a glue layer; and (a4) releasing the third temporary carrier to reveal the plurality of semiconductor blocks on diamond blocks, and attaching the first temporary carrier to the revealed plurality of semiconductor blocks and releasing the second temporary carrier.

13. The method in claim 12, wherein before the step (a1) comprising:

(a11) treating the surfaces of the plurality of diamond blocks; and (a12) bonding the treated surfaces of the plurality of diamond blocks to the second temporary carrier with or without a glue layer.

14. The method in claim 12, wherein before the step (a2) comprising:

(a21) treating the surfaces of the plurality of semiconductor blocks; and (a22) bonding the treated surfaces of the plurality of semiconductor blocks to the third temporary carrier with or without a glue layer.

15. The method in claim 11, the step of filling the gaps among the plurality of diamond blocks and the gaps among the plurality of semiconductor blocks in step (b) comprising:

(b1) depositing a filler or a molding compound to fill the gaps among the plurality of diamond blocks and the gaps among the plurality of semiconductor blocks; and (b2) planarizing the filler or the molding compound to expose the plurality of diamond blocks.

16. The method in claim 11, wherein the first predetermined diameter is 12", and the first semiconductor substrate is a silicon or SOI substrate.

17. The method in claim 11, wherein the first predetermined diameter is 8", and the first semiconductor substrate is a SiC, silicon or GaN substrate.

18. The method in claim 11, wherein the step (a) comprises:

(a5) depositing a diamond layer and then a sacrificial layer on the plurality of semiconductor blocks;

(a6) planarizing and etching the sacrificial layer to form a plurality of composite blocks, each composite block comprising the diamond block on the semiconductor block; and (a7) attaching the plurality of composite blocks to the first temporary carrier with the first predetermined diameter to form the first temporary composite wafer.

19. The method in claim 11, wherein the step (a) comprises:

(a8) attaching the plurality of diamond blocks on a second temporary carrier with the first predetermined diameter;

(a9) attaching the plurality of semiconductor blocks on a third temporary carrier with the first predetermined diameter, wherein each semiconductor block is a SOI (silicon-on-insulator) block with a Si bulk, a $SiO_2$ layer, and a Si layer;

(a10) attaching the plurality of diamond blocks which is attached to the second temporary carrier to the plurality of SOI blocks which is attached to the third temporary carrier with or without a glue layer; and (a11) releasing the third temporary carrier to reveal the plurality of SOI blocks, removing the bulk Si and the $SiO_2$ layers from each SOI block to reveal the Si layers, attaching the first temporary carrier to the revealed Si layers, and releasing the second temporary carrier to form the first temporary composite wafer.

20. A method to form a first diamond composite IC wafer or a second diamond composite IC wafer, comprising:

preparing a first semiconductor wafer with a first predetermined diameter, wherein the first semiconductor wafer includes a set of IC circuits on a first side of the first semiconductor wafer;

preparing a plurality of diamond blocks or a diamond wafer with the first predetermined diameter;

bonding the plurality of diamond blocks to the first semiconductor wafer, and filling gaps among the plurality of diamond blocks to form the first diamond composite IC wafer; or bonding the diamond wafer to the first semiconductor wafer to form the second diamond composite IC wafer.

21. The method in claim 20, wherein before the step (c), further comprises:

(c1) depositing a surface layer on the plurality of diamond blocks or the diamond wafer, and then depositing a first bonding layer on the surface layer;

(c2) depositing a diffusion barrier layer on a second side of the first semiconductor wafer, and then depositing a second bonding layer on the diffusion barrier layer, wherein the second side is opposite to the first side.

22. The method in claim 21, wherein the surface layer is Ti, the first bonding layer is Au, solder, or a transient liquid phase material, the diffusion barrier layer is Ti, TiN, Ti/TiN or Ti/Ni—V, and the second bonding layer is Au or solder.

23. The method in claim 20, further comprising:

(d1) bonding the first diamond composite IC wafer or the second diamond composite IC wafer to a second semiconductor wafer with the first predetermined diameter, wherein the second semiconductor wafer includes another set of IC circuits on a first side of the second semiconductor wafer.

24. The method in claim 23, wherein the first diamond composite IC wafer or the second diamond composite IC wafer is bonded to the second semiconductor wafer through oxide-to-oxide or polyimide (PI)-to-PI based copper hybrid bonding.

25. The method in claim 20, further comprising:

(d2) bonding the first diamond composite IC wafer or the second diamond composite IC wafer to a diamond containing interposer with the first predetermined diameter, wherein the diamond containing interposer comprises a diamond layer and an oxide or PI bonding layer in the re-distribution layer for oxide-to-oxide or PI-to-PI bonded to the first diamond composite IC wafer or the second diamond composite IC wafer.

* * * * *